US011723443B2

(12) United States Patent
Perkins et al.

(10) Patent No.: US 11,723,443 B2
(45) Date of Patent: Aug. 15, 2023

(54) CONSUMER PRODUCT ATTACHMENT SYSTEMS HAVING LOCKING OR EXPANSION CHARACTERISTICS

(71) Applicant: Apple Inc., Cupertino, CA (US)

(72) Inventors: Ryan C. Perkins, San Francisco, CA (US); Michael J. Webb, Scotts Valley, CA (US); Hsiang Hung Chen, New Taipei (TW); Motohide Hatanaka, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 205 days.

(21) Appl. No.: 17/174,225

(22) Filed: Feb. 11, 2021

(65) Prior Publication Data

US 2021/0161258 A1 Jun. 3, 2021

Related U.S. Application Data

(63) Continuation of application No. 16/231,061, filed on Dec. 21, 2018, now Pat. No. 10,945,496, which is a (Continued)

(51) Int. Cl.

*A44C 5/14* (2006.01)
*G04B 37/16* (2006.01)
(Continued)

(52) U.S. Cl.

CPC ............ *A44C 5/14* (2013.01); *A44B 11/2596* (2013.01); *A44B 11/263* (2013.01); *A44C 5/147* (2013.01);
(Continued)

(58) Field of Classification Search

CPC .. G04B 37/1486; G04B 37/1493; A44C 5/14; A44C 5/147; A44C 5/2085; A44C 5/142;
(Continued)

(56) References Cited

U.S. PATENT DOCUMENTS

| | | | |
|---|---|---|---|
| 2,126,263 A | | 8/1938 | Kestenman |
| 2,346,887 A | | 4/1944 | Winkler |

(Continued)

FOREIGN PATENT DOCUMENTS

| | | | |
|---|---|---|---|
| CH | 179155 A | * | 8/1935 |
| CH | 694393 | | 12/2004 |

(Continued)

OTHER PUBLICATIONS

Chinese Office Action from Chinese Patent Application No. 202010579707.8, dated Jan. 20, 2022, 15 pages including English language translation.

(Continued)

*Primary Examiner* — Jack W Lavinder
(74) *Attorney, Agent, or Firm* — BakerHostetler

(57) ABSTRACT

Embodiments of the present disclosure provide a locking assembly for an attachment system of a consumer product. More specifically, embodiments of the present disclosure are directed to an attachment unit that is configured to be inserted and removed from a housing of a consumer product. The attachment unit and/or the housing include an expansion component or other such locking assembly configured to releasably secure the attachment unit within the housing.

15 Claims, 19 Drawing Sheets

Related U.S. Application Data continuation of application No. 14/684,180, filed on Apr. 10, 2015, now Pat. No. 10,182,623.

(60) Provisional application No. 62/048,248, filed on Sep. 9, 2014, provisional application No. 62/036,080, filed on Aug. 11, 2014.

(51) Int. Cl.

| | |
|---|---|
| ***A44B 11/25*** | (2006.01) |
| ***A44B 11/26*** | (2006.01) |
| ***A44C 5/20*** | (2006.01) |
| ***G04B 37/14*** | (2006.01) |

(52) U.S. Cl.

CPC ........ *A44C 5/2085* (2013.01); *G04B 37/1486* (2013.01); *H05K 999/99* (2013.01); *A44D 2203/00* (2013.01)

(58) Field of Classification Search

CPC ..... A44C 5/185; A44C 5/145; Y10T 24/4718; Y10T 24/4782; Y10T 24/45602; A44B 11/2596; A44B 11/263; A44B 11/2503; A44D 2203/00

See application file for complete search history.

(56) References Cited

U.S. PATENT DOCUMENTS

| | | | |
|---|---|---|---|
| 2,408,279 | A | 9/1946 | Valcourt |
| 2,505,044 | A | 4/1950 | Hainrich |
| 2,518,551 | A | 8/1950 | Jaccarino |
| 2,775,861 | A | 1/1957 | Fachon |
| 3,165,884 | A | 1/1965 | Gwinner |
| 3,293,714 | A | 12/1966 | Kostanecki et al. |
| 3,376,616 | A | 4/1968 | Kaczorowski |
| 3,589,341 | A | 6/1971 | Krebs |
| 3,675,284 | A | 7/1972 | Rieth |
| 3,747,171 | A | 7/1973 | Montague, Jr. |
| 3,908,243 | A | 9/1975 | Lou |
| 4,068,355 | A | 1/1978 | Rey |
| 4,178,751 | A | 12/1979 | Liautaud |
| 4,217,681 | A | 8/1980 | Grohoski et al. |
| 4,234,115 | A | 11/1980 | Williams |
| 4,249,267 | A | 2/1981 | Voss |
| 4,401,388 | A | 8/1983 | Mearns |
| 4,414,714 | A | 11/1983 | Kostanecki et al. |
| 4,432,655 | A | 2/1984 | Wollman |
| 4,447,238 | A | 5/1984 | Eldridge, Jr. |
| 4,502,191 | A | 3/1985 | Savage |
| 4,615,185 | A | 10/1986 | Bollinger |
| 4,624,033 | A | 11/1986 | Orton |
| 4,648,161 | A | 3/1987 | Rosen |
| 4,941,236 | A | 7/1990 | Sherman et al. |
| 5,130,899 | A | 7/1992 | Larkin et al. |
| 5,146,437 | A | 9/1992 | Boucheron |
| 5,181,192 | A | 1/1993 | Paratte |
| 5,189,763 | A | 3/1993 | Voumard |
| 5,244,134 | A | 9/1993 | Riley |
| 5,305,503 | A | 4/1994 | Yamagata |
| 5,307,582 | A | 5/1994 | Quitel |
| 5,400,870 | A | 3/1995 | Inoue |
| 5,471,716 | A | 12/1995 | Takahashi |
| 5,522,529 | A | 6/1996 | Yurman |
| 5,668,784 | A | 9/1997 | Iguchi |
| 5,711,056 | A | 1/1998 | Taguchi |
| 5,788,400 | A | 8/1998 | Wey |
| 5,899,369 | A | 5/1999 | Macripo |
| 5,914,913 | A | 6/1999 | Shriqui |
| 5,930,873 | A | 8/1999 | Wyser |
| 5,991,978 | A | 11/1999 | Nussbaum |
| 6,014,793 | A | 1/2000 | Howald |
| 6,067,692 | A | 5/2000 | Chang |
| 6,163,938 | A | 12/2000 | Weber-Unger |
| 6,168,055 | B1 | 1/2001 | Grados |
| 6,170,131 | B1 | 1/2001 | Shin |
| 6,179,025 | B1 | 1/2001 | Sutton |
| 6,292,985 | B1 | 9/2001 | Grunberger |
| 6,311,373 | B1 | 11/2001 | Hashimoto |
| 6,505,385 | B2 | 1/2003 | Grunberger |
| 6,588,069 | B2 | 7/2003 | Deriaz et al. |
| 6,598,271 | B2 | 7/2003 | Nire |
| 6,606,767 | B2 | 8/2003 | Wong |
| 6,631,669 | B2 | 10/2003 | Weldle |
| 6,647,597 | B2 | 11/2003 | Reiter |
| 6,678,898 | B2 | 1/2004 | Jones et al. |
| 6,701,580 | B1 | 3/2004 | Bandyopadhyay |
| 6,712,501 | B2 | 3/2004 | Kinkio |
| 6,726,070 | B2 | 4/2004 | Lautner |
| 6,746,058 | B2 | 6/2004 | Kienzler |
| 7,243,824 | B2 | 7/2007 | Tabata |
| 7,363,687 | B2 | 4/2008 | Kraus et al. |
| 7,373,696 | B2 | 5/2008 | Schoening et al. |
| 7,380,979 | B2 | 6/2008 | Hiranuma |
| 7,451,527 | B2 | 11/2008 | Sima |
| 7,451,528 | B2 | 11/2008 | Sima |
| 7,505,018 | B2 | 3/2009 | Hozumi |
| 7,509,712 | B2 | 3/2009 | Sima |
| 7,526,840 | B2 | 5/2009 | Pemu |
| 7,640,632 | B2 | 1/2010 | Lazarus |
| 7,806,309 | B2 | 10/2010 | Korchmar |
| 7,882,601 | B2 | 2/2011 | Nguyen |
| 7,900,754 | B2 | 3/2011 | Carlson |
| 7,905,039 | B2 | 3/2011 | Karovic |
| 8,091,261 | B2 | 1/2012 | Chadwick |
| 8,191,209 | B2 | 6/2012 | Wolfgang |
| 8,196,935 | B2 | 6/2012 | Lin |
| 8,235,585 | B2 | 8/2012 | Speichinger |
| 8,240,011 | B2 | 8/2012 | Chevrolet |
| 8,261,416 | B2 | 9/2012 | Rothbaum et al. |
| 8,316,515 | B2 | 11/2012 | Slank |
| 8,471,658 | B2 | 6/2013 | Fullerton et al. |
| 8,486,481 | B2 | 7/2013 | Giuseppin et al. |
| 8,573,458 | B1 | 11/2013 | Hamilton |
| 8,578,569 | B1 | 11/2013 | Karnoski et al. |
| 8,615,849 | B2 | 12/2013 | Rothbaum |
| 8,671,725 | B2 | 3/2014 | Nicoara |
| 8,787,006 | B2 | 7/2014 | Golko et al. |
| 8,789,246 | B2 | 7/2014 | Yliluoma et al. |
| 8,844,100 | B2 | 9/2014 | Humphries |
| 8,967,437 | B2 | 3/2015 | Wilson |
| 9,003,611 | B2 | 4/2015 | Catanese |
| 9,049,894 | B2 | 6/2015 | Wong |
| 9,357,817 | B2 | 6/2016 | Lee et al. |
| 9,392,829 | B2 | 7/2016 | Manuello |
| 9,877,549 | B2 | 1/2018 | Perkins |
| 2003/0116596 | A1 | 6/2003 | Terasawa |
| 2005/0102802 | A1 | 5/2005 | Sitbon et al. |
| 2005/0265132 | A1 | 12/2005 | Ho |
| 2006/0156520 | A1 | 7/2006 | Meranto |
| 2006/0186150 | A1 | 8/2006 | Willows et al. |
| 2006/0254105 | A1 | 11/2006 | Chang |
| 2007/0028429 | A1 | 2/2007 | Ishida |
| 2009/0133438 | A1 | 5/2009 | Stampfli et al. |
| 2009/0265832 | A1 | 10/2009 | Clement |
| 2010/0200627 | A1 | 8/2010 | Shen |
| 2010/0258601 | A1 | 10/2010 | Thrope |
| 2011/0083254 | A1 | 4/2011 | Trutna et al. |
| 2011/0226823 | A1 | 9/2011 | Jasa |
| 2011/0309121 | A1 | 12/2011 | Dooley et al. |
| 2012/0036626 | A1 | 2/2012 | Vogtner |
| 2012/0044031 | A1 | 2/2012 | Ninomiya |
| 2012/0055212 | A1 | 3/2012 | Nicoara |
| 2012/0216374 | A1 | 8/2012 | Manuello |
| 2013/0086774 | A1 | 4/2013 | Krasinski et al. |
| 2013/0205476 | A1 | 8/2013 | Gentile et al. |
| 2013/0286796 | A1 | 10/2013 | Chatelain |
| 2013/0305780 | A1 | 11/2013 | Christ |
| 2013/0326790 | A1 | 12/2013 | Cauwels et al. |
| 2014/0083133 | A1 | 3/2014 | Lee et al. |
| 2015/0174854 | A1 | 6/2015 | Siahaan |
| 2015/0181749 | A1 | 6/2015 | Gong |
| 2016/0003269 | A1 | 1/2016 | Russell-Clarke et al. |
| 2016/0010673 | A1 | 1/2016 | Russell-Clarke et al. |

(56) References Cited

U.S. PATENT DOCUMENTS

| | | | |
|---|---|---|---|
| 2016/0025119 A1 | 1/2016 | Russell-Clarke et al. | |
| 2016/0037870 A1 | 2/2016 | Perkins | |
| 2016/0037876 A1 | 2/2016 | Perkins et al. | |
| 2016/0037877 A1 | 2/2016 | Perkins et al. | |
| 2016/0037878 A1 | 2/2016 | Yabe et al. | |
| 2016/0040695 A1 | 2/2016 | Perkins et al. | |
| 2016/0040698 A1 | 2/2016 | Perkins et al. | |
| 2016/0069371 A1 | 3/2016 | Chen | |
| 2016/0233034 A1 | 8/2016 | Sheng | |
| 2017/0181510 A1 | 6/2017 | Novak | |
| 2017/0265607 A1 | 9/2017 | Hatanaka | |
| 2018/0011448 A1 | 1/2018 | Von Allmen | |
| 2018/0090890 A1 | 3/2018 | Kaliman | |

FOREIGN PATENT DOCUMENTS

| | | | |
|---|---|---|---|
| CH | 704810 | 10/2012 | |
| CN | 2052214 | 2/1990 | |
| CN | 1147358 | 4/1997 | |
| CN | 1181412 | 5/1998 | |
| CN | 3118417 | 8/1999 | |
| CN | 3184158 | 4/2001 | |
| CN | 3210240 | 11/2001 | |
| CN | 3229132 | 3/2002 | |
| CN | 2575724 | 9/2003 | |
| CN | 2706786 | 6/2005 | |
| CN | 200983868 | 12/2007 | |
| CN | 101535920 | 9/2009 | |
| CN | 201446979 | 5/2010 | |
| CN | 101843393 | 9/2010 | |
| CN | 201709560 | 1/2011 | |
| CN | 102202533 | 9/2011 | |
| CN | 202026953 | 11/2011 | |
| CN | 102282525 | 12/2011 | |
| CN | 202060129 | 12/2011 | |
| CN | 102392556 | 3/2012 | |
| CN | 102576213 | 7/2012 | |
| CN | 202587325 | 12/2012 | |
| CN | 202664274 | 1/2013 | |
| CN | 202704189 | 1/2013 | |
| CN | 202850585 | 4/2013 | |
| CN | 103355880 | 10/2013 | |
| CN | 3329483 | 12/2013 | |
| CN | 103488076 | 1/2014 | |
| CN | 203435257 U | 2/2014 | |
| CN | 103670062 A | 3/2014 | |
| CN | 103802695 | 5/2014 | |
| CN | 103895602 | 7/2014 | |
| EP | 2098131 | 9/2009 | |
| EP | 2141554 | 1/2010 | |
| EP | 2319349 A1 * | 5/2011 | ............... A44C 5/14 |
| FR | 1291875 | 4/1962 | |
| FR | 2492238 | 4/1982 | |
| FR | 2532239 | 3/1984 | |
| GB | 464417 | 4/1937 | |
| GB | 865498 | 4/1961 | |
| GB | 1491532 | 11/1977 | |
| GB | 2113975 | 8/1983 | |
| GB | 2079359 B | 11/1983 | |
| GB | 2355281 | 4/2001 | |
| HK | 0501949.8 | 8/2005 | |
| HK | 1001605.7 | 9/2010 | |
| JP | S 60-178382 | 9/1985 | |
| JP | S 63-187913 | 12/1988 | |
| JP | H 06-62387 | 9/1994 | |
| JP | 3753756 B | 3/2006 | |
| JP | 2013254878 | 12/2013 | |
| TW | 440751 | 6/2001 | |
| TW | M380273 U1 | 5/2010 | |
| TW | 201336387 A | 9/2013 | |
| WO | WO 2010/036090 | 4/2010 | |
| WO | WO 2011/048344 | 4/2011 | |
| WO | WO 2012/160195 | 11/2012 | |
| WO | WO 2013/140080 | 9/2013 | |

OTHER PUBLICATIONS

Extended European Search Report from European Patent Application No. 21185157.1, dated Nov. 8, 2021, 9 pages.

Author Unknown, “Ikepod Wristwatches by Mark Newson,” http://www.dezeen.com/2007/12/10/ikepod-wristwatches-by-marc-newson/, 32 pages, Dec. 10, 2007.

Author Unknown, “Tajan,” http://www.tajan.com/pdf/7812.pdf, 2 pages, Dec. 10, 2007.

Author Unknown, “v2.0 Ikepod has landed . . . again . . . ,” http://qp.granularit.com/media/38876/QP24_ikepod.pdf, 3 pages, at least as early as Apr. 25, 2015.

Author Unknown, Boucheron Paris, Reflect Collection, http://us.boucheron.com/en_us/the-creations/watches/reflet.html, 4 pages, at least as early as Apr. 10, 2015.

“Consumer Product Safety Act,” (Public Law 92-573; 86 Stat. 1207, Oct. 27, 1972); https://www.cpsc.gov/PageFiles/105435/cpsa.pdf?epslanguage=en site visited on Apr. 27, 2018, 118 pages.

Chinese Office Action from Chinese Patent Application No. 201510485843.X, dated May 17, 2018, 17 pages including partial English language translation.

Chinese Office Action from Chinese Patent Application No. 201510490138.9, dated Jun. 5, 2018, 22 pages including partial English language translation.

Chinese Office Action from Chinese Patent Application No. 201510490182.X, dated Sep. 12, 2019, 10 pages including English language translation.

European Office Action from European Patent Application No. 15180630.4 dated Apr. 24, 2019, 5 pages.

European Office Action from European Patent Application No. 15180630.4, dated Jun. 5, 2020, 5 pages.

International Search Report and Written Opinion, PCT/US2015/040692, 11 pages, dated Nov. 4, 2015.

International Search Report and Written Opinion, PCT/US2015/044391, 12 pages, dated Nov. 4, 2015.

International Search Report and Written Opinion, PCT/US2015/044392, 10 pages, dated Nov. 4, 2015.

Taiwanese Office Action from Taiwanese Patent Application No. 105110803, dated Mar. 4, 2020, 15 pages including English language translation.

Chinese Office Action from Chinese Patent Application No. 202010579707.8, dated Jun. 2, 2021, 23 pages including English language translation.

* cited by examiner

CONSUMER PRODUCT ATTACHMENT SYSTEMS HAVING LOCKING OR EXPANSION CHARACTERISTICS

CROSS-REFERENCE TO RELATED APPLICATION

This application is a continuation of U.S. patent application Ser. No. 16/231,061, filed Dec. 21, 2018, which is a continuation of U.S. patent application Ser. No. 14/684,180, filed Apr. 10, 2015, now U.S. Pat. No. 10,182,623, issued Jan. 22, 2019, which is a nonprovisional patent application of and claims the benefit to U.S. Provisional Patent Application No. 62/048,248, filed Sep. 9, 2014 and titled "Attachment Systems for Consumer Products," and U.S. Provisional Patent Application No. 62/036,080, filed Aug. 11, 2014, and titled "Attachment Mechanism for an Electronic Device," the disclosures of which are hereby incorporated herein by reference in their entirety.

TECHNICAL FIELD

The present disclosure is directed to an attachment system for releasably coupling an object to a consumer product. More specifically, the embodiments described herein are directed to attachment systems having locking or expansion characteristics.

BACKGROUND

Consumer products such as watches, cameras, phones, purses, and glasses may include one or more accessories attached thereto. The manner in which the accessories are attached may be widely varied. However, the attachment of these accessories suffer from similar if not the same drawbacks. For example, many consumer products typically do not include user-friendly attachment mechanisms. Furthermore, even when products have user oriented attachment mechanisms, they may not provide adequate retention force. Even if the retention force is adequate, the mechanism used may be quite robust and large thereby adversely affecting the elegance of the consumer product.

In one example, wristwatches typically include a case and a strap. The case carries the watch mechanisms including the watch face. The strap extends away from the case so that it can wrap around the wrist of a user. The strap may be integral with the case. However, in most cases, the strap is a separate part that is attached to the case. For example, the case may include a pin that captures the strap thereby attaching the strap to the case. In order to detach the strap from the case, the pin needs to be removed. In some instances, the user may need to visit a specialty store in order to have the pin and strap removed.

In another example, a pair of glasses, such as, electronic glasses, sunglasses and the like, may have temples or stems that extend from a frame. The temples or stems may be coupled to the frames by a screw, a pin or other such mechanism. However, it may be difficult to remove or replace the temples or stems without use of a specialized tool or without visiting a specialty store.

In still yet another example, other electronic devices may be coupled to a lanyard or other type of strap. For example a camera, a remote control, a game controller and the like may have a lanyard that is attached to a housing. However, it may be difficult to attach the lanyard to the housing as a portion of the lanyard is typically required to be inserted into a small opening within the housing. In this example, as with the other examples discussed above, the lanyard, accessory, object or article may not be attached to the electronic device or consumer product in a manner that is secure and aesthetically pleasing.

It is with respect to these and other general considerations that embodiments have been made. Although relatively specific problems have been discussed, it should be understood that the embodiments should not be limited to solving the specific problems identified in this background.

SUMMARY

This summary is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

Provided herein is an attachment system for a consumer product. As will be explained in detail below, the attachment system may be used to couple an article, an object, an accessory and the like to the consumer product. For example, the object, article, or accessory may be a cover, a lanyard, a band, a strap, a dock and the like. Likewise, the consumer product may be an electronic device, a mechanical device, an electromechanical device and so on. Accordingly, the object may be securely coupled to the attachment system or removably coupled to the attachment system. The attachment system may then be removably coupled to the electronic device.

As also described herein, the object, the attachment system and the consumer product may comprise an ecosystem whereby each of the object, the attachment system and the consumer product are interchangeable with respect to one another. Thus, a single attachment system may be used with various objects, various attachment systems may be used with various consumer products and so on. In embodiments where the object is securely coupled to the attachment system, the attachment system and the object combination may be interchangeable with a replacement attachment system and object combination. In this manner, objects (such as bands) having different characteristics may be matched or used with a single consumer product, thereby allowing the band to be easily and efficiently changed or swapped. One band may be changed out for another to account for environmental differences, operational features, functional characteristics, appearance, and so on.

Additionally, the consumer product may be changed out such that multiple consumer products may be coupled to a given band, although not necessarily simultaneously. A band may be connected to a media player through an attachment system associated with on one or both of the band and media player, as one example. The media player may be removed from the band and a portable health monitor or timekeeping device may then be attached to the band using the same attachment system or a compatible attachment system.

The interoperability of bands and devices may be facilitated by a common attachment system. The attachment system may be received into a receiving module on a consumer product and may also be coupled to the band using a mating structure. By maintaining commonality of receiving modules across consumer products and commonality of mating structures across bands, interchangeability, functionality and choice may be enhanced. This may permit a variety of unique use cases, including using a band to physically connect two consumer products to one another presuming the band has a mating structure at both ends. Likewise, by providing a group of objects (bands, accessories, lanyards, charging mechanisms, data transfer mechanisms, cables, stands, supports, structures, and so on) that each have a common mating structure that may be utilized by the attachment system, and a group of consumer products that each have a common receiving module for receiving the attachment system, an ecosystem of objects and devices may be formed to provide increased choice, flexibility, operation and interoperability to a user.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1B:
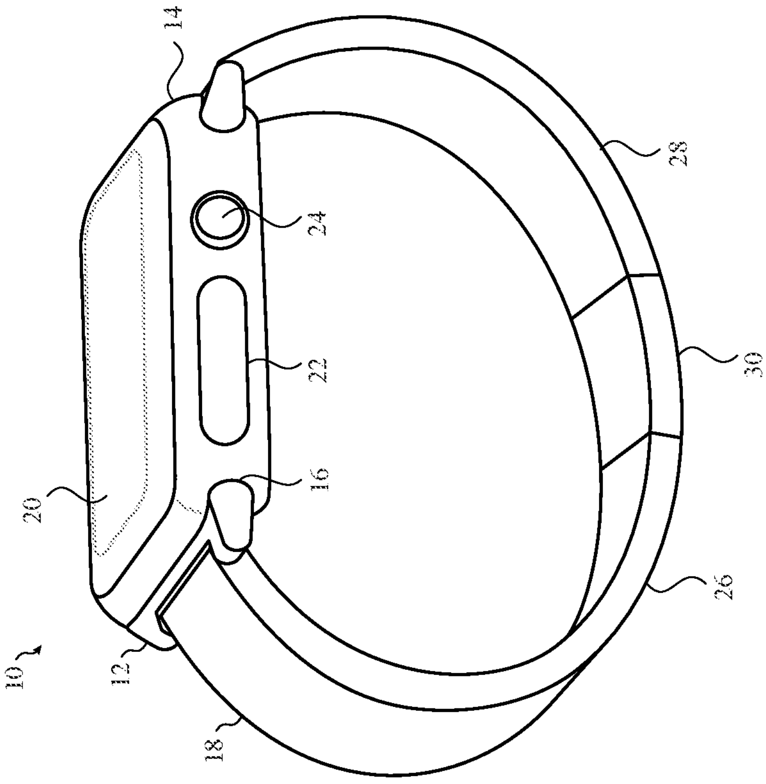
FIG. 1B illustrates an exemplary consumer product that includes an accessory according to one or more embodiments of the present disclosure.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Provided herein is an attachment system for a consumer product. The attachment system may include a removable module or an attachment unit that interfaces with some portion of the consumer product. For example, the removable module may engage with a related or corresponding module, recess, aperture or component of, or associated with, the consumer product. When engaged, the removable module may be carried by the consumer product. For example, when the removable module is engaged with the consumer product, the module and the consumer product may become an integrated unit. In some cases, the removable module can extend the functionality of the consumer product. That is, the attachment system and/or the removable module can provide additional operability to the consumer product. Additionally or alternatively, the removable module may be used as an accoutrement to the consumer product.

For example, the removable module may add an aesthetic or structural enhancement to the consumer product. Additionally or alternatively, the removable module may be configured to couple another object or article to the consumer product. For example, the object may be an accessory such as a cover, skin, plate, lanyard, band, strap, dock and/or the like. In all of these examples, the interface between the removable module and the consumer product may be a standard interface such that different functionality, accoutrements, and objects can be coupled to the consumer product.

The consumer product that may be used in conjunction with the attachment system can be widely varied. By way of example and not by way of limitation, the consumer product may be an electronic device, a mechanical device, an electromechanical device and the like. In one example, the consumer product is a portable consumer product. In another example, the consumer product is a wearable product. Additional and more specific examples of the consumer product include mobile phones, personal digital assistants, music players, timekeeping devices, health monitoring devices, tablet computers, laptop computers, glasses (electronic or otherwise), portable storage devices and the like. Although the examples above include electronic devices, the attachment system of the present disclosure may be used with non-electronic devices.

As will also be described below, the attachment system of the present disclosure typically includes a product side attachment assembly and a non-product side attachment assembly that can engage and disengage to and from one another. Each of these assemblies may, for example, include a lug portion that physically interface with one another in order to secure the two assemblies together. The assemblies may also releasably interface with one another in order to free the assemblies from each other.

In one embodiment, the attachment system includes a removable module that mechanically engages to and disengages from a component of the consumer product. The module may be coupled with and removed from the component of the consumer product. In one example, the component may be a housing or a portion of the housing of the consumer product. For example, the removable module may include a first lug portion configured for attachment to a second lug portion of the housing (or case) of the consumer product (e.g., a lug portion integrated with the housing). In another example, the component may be a module that is fixed to, recessed in, or extends from or is otherwise attached to the housing of the consumer product. For example, the removable module may have a first lug portion configured for attachment to a second lug portion, which is fixed to and extends from the housing (or case) of the consumer product. In another example, the first lug portion of the consumer product may be received into a recess or channel within the housing.

In one embodiment, the removable module of the attachment system may be configured to be inserted into an opening on the consumer product. The insertion may be a lateral insertion, a frontal insertion, and so on. Once the removable module, has been inserted into the opening, the removable module may slide within the opening of the consumer product. For example, the consumer product may have a channel that is disposed on one or more sides of a housing of the consumer product. The channel may be configured to follow the shape of the housing. Once the end portion of the removable module has been inserted into the channel, the removable module may slide further into the channel.

The sliding motion of the removable module may continue until the removable module is secured or otherwise coupled to or within the channel. Just as the removable module is configured to slide into the channel of the consumer product, the removable module may also slide out of the channel of the consumer product. Thus, the removable module may be easily inserted into and removed from the consumer product.

In other cases the removable module may be forwardly inserted into (or inserted straight into) the channel or opening of the housing. For example, the removable module may be inserted into a front face of the channel or other such opening in a housing and be secured in place using one or more securement mechanisms in or on the channel and/or in or on the removable module.

In another embodiment, the attachment system may be shaped to mechanically interlock with the consumer product. In such embodiments, a removable module of the attachment system may have a first shape that corresponds to a shape of a receiving module that is associated with or part of the consumer product. For example, the length, width, height, shape and other dimensions of the removable module may similar to or otherwise correspond with the length, width, height and shape of the receiving module. As such, when the removable module is placed within the receiving module of the consumer product, the removable module is integrated (either partially or entirely) with the consumer product.

In one embodiment, the attachment system includes a locking mechanism. The locking mechanism may be integrated with the removable module of the attachment system. Further the locking mechanism may be configured to interact with the receiving module of the consumer product. As such, as the removable module is inserted into the receiving module of the consumer product, the locking mechanism interfaces with a portion of the receiving module to lock or otherwise secure the removable module within the receiving module.

The locking mechanism may also be configured to interface with a releasing mechanism associated with the receiving module. The releasing mechanism, or a portion of the releasing mechanism, may be part of, or integrated with, the receiving module. As such, when the locking assembly has been received into the receiving module, the releasing mechanism may be actuated. Actuation of the releasing mechanism causes the locking mechanism to be removed from the portion of the receiving module and enables the removable module to slide within the receiving module.

In other cases, the locking mechanisms may be contained within the housing of the consumer product. As such, the housing may be configured to insert at least a portion of a locking mechanism into a receiving aperture of the removable module. Accordingly, the removable module may be configured to trigger a release of the locking mechanism from the receiving aperture of the removable module.

In addition to the above, the attachment system of the present disclosure may have various other components and modules that enables the removable module to engage with and be disengaged from the consumer product. For example the attachment system may have various pads disposed on a surface of the removable module to assist or otherwise enable the removable module to slide within the receiving module of the consumer product. The pads may also be used to prevent undesired movement of the removable module once the removable module has been locked within the receiving module and maintain spacing between the removable module and the receiving module.

The attachment system may also be used to secure various accessories to the consumer product. For example, an accessory, article or object may be coupled or otherwise attached to the removable module of the attachment system. Further, the accessory, article or object may be used to secure the consumer product to a user. For example, the attachment system may be removably coupled to a housing or a receiving module of the consumer product.

The consumer product may be configured to receive multiple different bands, accessories and the like. The consumer product, and the associated bands, may each include a common node that couples to a corresponding node associated with the consumer product. Accordingly, the consumer product may have a plurality of accessories or bands that may be interchangeable thereby providing a user many different aesthetic looks for the consumer product. More specifically, the consumer product may be configured to receive a first band, and second band which is different than the first band. Further, each of the first band and the second band may include a common node that couples to, or is received by, a corresponding node in the consumer product. Thus, each band may be interchangeable with respect to one another and with other bands and/or accessories.

Furthering the example from above, a band or strap may be removably coupled to the attachment system and may further be used to secure the consumer product to the user. Because the attachment system is removably coupled to both the housing of the consumer product and a band or strap, the attachment system itself, or the band or strap, may be interchangeable with numerous other bands having different materials, designs and configurations.

In one particular embodiment, the consumer product is a portable electronic device. More specifically, the consumer product is may be a wearable consumer product. A wearable consumer product is one that can be worn by or otherwise secured to a user. For example, the wearable electronic device may include, but is not limited to a wearable computer, a wearable watch, a wearable communication device, a wearable media player, a wearable health monitoring device, and/or the like. In cases such as these, the attachment system may be used to couple a band, a strap, a sleeve or various types of clothing to the wearable consumer product. For example, in the case of a wrist worn product, the removable module of the attachment system may carry a band that can be wrapped around and secured to a user's wrist when the removable module is attached to the wearable product. It should be appreciated, however, that the above examples are not limitations.

In certain embodiments, the band, the attachment system and/or portions of each may be made up of a variety of different materials and/or configurations. In certain embodiments, the band and/or the attachment system, may be made from rubber, metal, woven fiber, leather, rubber overlaying a woven mesh, silicon, Milanese mesh, and so on. In some embodiments, a first band, or a first portion of a first band may be made up of a first material and a second bad, or a second portion of the first band, may be made from a second different material. The band may also be made up of a plurality of links with the attachment system forming one or more of the links. As such, the band may be resizable by, for example, adding or removing links.

In some embodiments, the bands may be coupled to respective attachment systems using pins, holes, adhesives, screws, and so on. In yet other embodiments, the band may be co-molded or overmolded with at least a portion of the attachment mechanism.

These and other embodiments are discussed below with reference to the figures. However, those skilled in the art will readily appreciate that the detailed description given herein with respect to these figures is for explanatory purposes only and should not be construed as limiting.

Figure 1A:
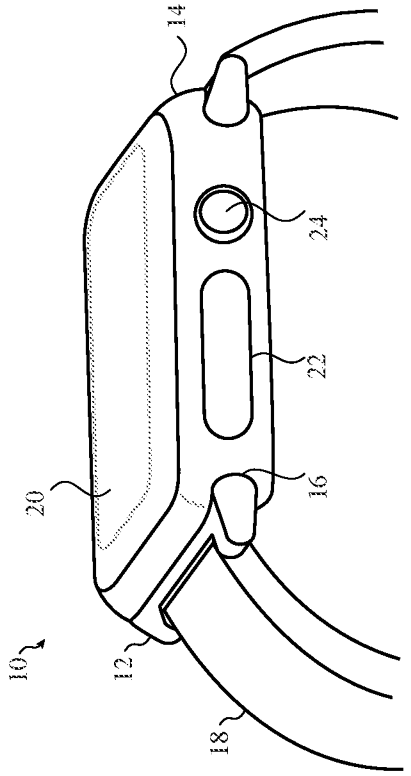
FIG. 1A illustrates an exemplary attachment system of a consumer product configured to removably receive an attachment unit according to one or more embodiments of the present disclosure.

FIG. 1A illustrates an exemplary consumer product 10 that may be used with an attachment unit 12 of an attachment system according to one or more embodiments of the present disclosure. The consumer product 10 may include a base unit (shown in FIG. 1A as a housing 14) and one or more attachment units (shown in FIG. 1A as attachment unit 12) capable of being removably coupled to the housing 14. The housing 14 may, for example, include a coupling node (shown in FIG. 1A as channel 16) that mechanically engages a corresponding coupling node on the attachment unit 12. The coupling nodes may be widely varied. The coupling node on the housing 14 includes an opening while the coupling node on the attachment unit 12 includes a lug that fits within the opening. The opening may be configured in a variety of different shapes and orientations. Further, the opening is configured to removably receive the lug such as will be described in detail below.

The attachment unit 12 may be laterally inserted into the housing 14 of the consumer product 10. As such, the attachment unit 12 may be configured to slide relative to the housing 14 of the consumer product 10. In other embodiments, the attachment unit 12 may be pressed, snap fit or otherwise forwardly inserted into the channel 16 of the housing 14. Once inserted, the attachment unit 12 may be locked or otherwise secured within the housing 14.

In some embodiments, the attachment unit 12 may include a rounded body and one or more arms that extend from the body. This shape of the body may be a teardrop shape. In other embodiments, the shape of the body may be rectangular, square or other such shape. The arms may have substantially planar outer side surfaces that flare outwardly from a first end to a second rounded end. In another embodiment, the top and/or bottom surface of the body may be flat or substantially flat and have at least one rounded side wall that transitions from the flat top surface to the flat bottom surface. In other configurations, the surfaces of the body may be elongated and rounded. More specifically, a top surface of the body may be rounded and also have one rounded sidewall (or front portion) that transitions to a bottom surface. As will be explained below, one or more locking assemblies may extend from the bottom surface, the top surface and/or the rounded surface. In other implementations, the top surface, the bottom surface and/or the rounded surface may have one or more recesses that are used to receive a locking assembly.

Although not shown, the attachment unit 12 may include one or more friction pads. The friction pads may be positioned on both the bottom surface of the body and the top surface of the body. Further, the friction pads may be positioned on either side of the locking assembly. In other embodiments, the friction pads may not be present.

In certain embodiments, the attachment unit 12 includes arms that extend from the body. The arms of the attachment system may have a width that starts narrow at one end and gets wider the closer the arms get to the body of the attachment unit 12. That is, the arms may have a narrow width at a proximal end and have a wider width as the arms are integrated with the body. In some embodiments, each arm may have a sidewall that extends along the outside of the attachment unit 12 that make up a width of the attachment unit 12. In some embodiments, the arms may be joined by a bar that creates an opening such as shown below. The opening may be used to receive a band or other accessory.

In some embodiments, the sidewalls of each arm (whether separate or integrated) may be angled and/or tapered. More specifically, the sidewall of each arm may be angled or slanted from the top surface of the body toward the bottom surface of the body.

Although the attachment unit 12 may be locked in place within the housing 14, actuation of a button assembly (e.g., button assembly 34 of FIG. 1D) or other types of actuators on the housing 14 release the attachment unit 12 which enables the attachment unit 12 to be removed from the housing 14. In some embodiments, the button assembly 34 (FIG. 1D) may be disposed on an underside (32 of FIG. 1D) of the housing 14. In other embodiments, the button assembly 34 (FIG. 1D) may be disposed or positioned on a top side of the housing 14. Further, the button assembly 34 may be placed at various locations on the underside and/or the top side of the housing 14. In some cases, the actuator or button assembly that is used to release the attachment unit 12 from the housing 14 may be located on the attachment unit 12. In some cases, an applied force on the attachment unit 12 in a particular direction may cause the locking assembly to retract or otherwise release the attachment unit 12 from within the housing 14 such as will be described below.

Although a single attachment unit 12 is discussed, a plurality of attachment units 12 may be coupled to the consumer product 10. For example, as shown in FIG. 1A, an attachment unit 12 may be coupled to a first side of the consumer product 10 and a second attachment unit 12 may be coupled to a second side of the consumer product 10.

When multiple attachment units 12 are used, the consumer product 10 may have a channel 16 or other such coupling node on a first side of the housing 14 and a second channel 16 or other such coupling node on a second side of the housing 14. The channel 16 on the first side of the housing 14 of the consumer product 10 may receive one of the attachment units 12 and the channel 16 on the second side of the housing 14 of the consumer product 10 may receive another attachment unit 12. Further, each of the attachment units 12 may be inserted into their respective channels 16 such as described above.

Each attachment unit 12 may have a specific shape, size or orientation based on the channel 16 the attachment unit 12 is to be inserted into. For example, a first attachment unit 12 may have a circular orientation and/or a first size that corresponds to a shape and/or size of the channel 16 on the first side of the housing 14 of the consumer product 10. Likewise, a second attachment unit 12 may have a second size and/or shape that corresponds to a shape and/or size of the channel 16 on the second side of the housing 14 of the consumer product 10. In other embodiments, each attachment unit 12 may have the same shape and/or size and can therefore be interchangeable with respect to one another.

In addition to the above, the first attachment unit 12 may be coupled to the consumer product 10 while the second attachment unit 12 is detached or removed from the consumer product 10. Likewise, the second attachment unit 12 may be coupled to the consumer product 10 while the first attachment unit 12 is removed from the consumer product 10. The first attachment unit 12 may be configured to receive a first accessory, object or article or type of accessory, object or article. Likewise the second attachment unit 12 may be configured to receive an accessory, object or article that is similar to, or different from, the accessory, article or object that is coupled to the first attachment unit 12.

The channel 16 may include a recess or other opening that is configured to receive a locking assembly of the attachment unit 12. In some embodiments, the recess may be disposed on a single side of the channel 16 or on multiple sides of the channel 16. In some cases, the channel 16 may include various grooves that are configured to mate with protrusions or ribs disposed on the attachment unit. In other cases, the channel 16 may include ribs or other protrusions that are configured to mate with corresponding grooves or striations on the attachment unit 12.

In some embodiments, the recess is positioned within the channel 16 such that the locking assembly of the attachment unit 12 is aligned with the recess when the sides of the locking assembly are flush or substantially flush with respect to the channel 16 and/or one or more sidewalls of the housing 14. For example, the channel 16 of the housing 14 is configured to receive either a proximal end or a distal end of the attachment unit 12. Once either the proximal end or the distal end of the attachment unit 12 has been received by the channel 16, the attachment unit 12 may slide or move within the channel until the locking mechanism of the attachment unit 12 expands into, engages with, or otherwise enters, the recess contained within the channel 16. In embodiments in which the locking assembly is contained within housing 14 or the channel 16, the attachment unit 12 may be inserted into the channel 16 or otherwise move within the channel 16 until the locking assembly of consumer product 10 is received into a locking recess disposed on the attachment unit 12.

To release the attachment unit 12 from the channel 16, a button assembly (e.g., button assembly 34 of FIG. 1D) associated with the housing 14 is actuated (or a button assembly on the attachment unit 12 is actuated in embodiments where the locking assembly is contained in the housing 14). Actuation of the button assembly 34 expels the locking assembly from the recess and enables the attachment unit 12 to once again freely move or slide within the channel 16 of the housing 14 or be pulled out from the front face of the channel 16.

As briefly discussed above, one or more accessories 18, objects or articles may be coupled to each attachment unit 12. More specifically, each accessory 18 may be removably coupled to the consumer product 10 using one or more of the attachment units 12.

In another example, each accessory 18 that is coupled to a respective attachment unit 12 may be different structures or part of the same structure. As such, one end of the accessory 18 may be removably coupled to the attachment unit 12 while a second end of the accessory 18 may be coupled to another accessory 18 or to a user. In some embodiments, the accessory 18 may be integrated with the attachment unit 12. As such, the accessory 18 may not be removable from the attachment unit 12. In such instances, the attachment unit 12 and accessory combination may be interchangeable with a different attachment unit 12 and accessory combination.

The accessory 18 may be interchangeable with respect to the attachment unit 12. Thus, the accessory 18, the attachment unit 12 and the housing 14 of the consumer product 10 (or the consumer product 10 itself), and various combinations thereof, may comprises an ecosystem whereby each component of the ecosystem may be interchangeable with respect to one another. For example, one attachment unit 12 may be used with various accessories. In another embodiment, various attachment units 12 may be used with a single consumer product 10. In yet another embodiment, a single accessory 18 and/or a single attachment unit 12 may be used in various consumer products 10.

In some embodiments, the attachment unit 12 may be coupled to the consumer product 10 or secured within the receiving component of the consumer product 10 using a clasp 30 or other attachment means such as, for example, magnets, snaps, and the like. In other embodiments, the accessory 18 may be secured, coupled or otherwise attached to the attachment unit 12 using a variety of attachment means. Examples of such include, but are not limited to a clasp, a removable pin, magnets, snaps, and other such attachment means. In other embodiments, the accessory 18 may be secured to the attachment unit 12 by being overmolded to, woven onto, or otherwise integrated with the attachment unit 12.

The consumer product 10 may be widely varied. In some embodiments the consumer product 10 may be a wearable consumer product 10. Additionally or alternatively, the consumer product 10 may be an electronic device. In yet other embodiments, the consumer product 10 may be a portable computing device. Examples include cell phones, smart phones, tablet computers, laptop computers, timekeeping devices, computerized glasses and other wearable devices navigation devices, sports devices, accessory devices, health-monitoring devices, medical devices, wristbands, bracelets, jewelry, and/or the like.

In one example and as shown in FIG. 1A, the consumer product 10 may be a wearable multifunctional electronic device. The wearable multifunctional electronic device may have various functionalities and/or capabilities described above (e.g., computing, communication, timekeeping or time display, health monitoring, health tracking and/or health output functionalities/capabilities, etc.). In another example, the consumer product 10 is a wrist worn multifunctional device and may include various components and/or modules. In another example, the consumer product 10 may act as an extension of another electronic device (or vice versa). For example, if the consumer product 10 is configured as a wrist worn device, it may serve as a watch like device that can interact with a phone that is carried by (e.g., in a pocket) or otherwise associated with the user.

The consumer product 10 may include a housing 14. The housing 14 serves to surround a peripheral region of the consumer product 10 as well as support the internal components of the consumer product 10 in their assembled position. That is, the housing 14 may enclose and support various internal components (including for example integrated circuit chips, processors, memory devices and other circuitry) to provide computing and functional operations for the consumer product 10. The housing 14 may also help define the shape or form of the consumer product 10. That is, the contour of the housing 14 may embody the outward physical appearance of the consumer product 10. As such, it may include various ornamental and mechanical features that improve the aesthetical appearance and tactile feel of the device. The housing 14 may be formed as a single piece, which may enhance the structural rigidity, water impermeability, and manufacturability of the housing 14.

For example, as shown in FIG. 1A, the housing 14 may have a rectilinear shape although other shapes are contemplated. The housing 14 may also have a substantially planar or flat top surface on which a display 20 may be positioned and a substantially planar or flat bottom surface. Although the top surface of the housing 14 and the bottom surface of the housing 14 may be substantially planar, the transition between the top surface of the housing 14 and one or more sidewalls of the housing may be curved. Put another way, the transition from the top surface to the one or more sidewalls of the housing (e.g., including a side in which the channel 16 is positioned) may be rounded such that a smooth transition is present between the top surface and the sides of the housing 14. Likewise, the transition from the bottom surface of the housing 14 to one or more sidewalls of the housing 14 may have a similar rounded shape and transition. In some cases, the shape of the housing may be rounded. In such embodiments, the channel 16 may also be rounded.

The housing 14 and the attachment unit 12 may be formed of plastic, glass, ceramics, fiber composites, metal (e.g., stainless steel, aluminum, etc.), other suitable materials, or a combination of these materials. Further, the surface of the housing 14 and the attachment unit 12 may be formed from any suitable material, including aluminum, steel, gold, silver and other metals, metal alloys, ceramics, wood, plastics, various types of glass and combinations thereof, and the like.

The consumer product 10 may include various components that may be disposed on the outside of the housing 14, within the housing 14, through the housing 14, inside the housing 14 and so on. For example, the housing 14 may include a cavity for retaining components internally as well as holes or windows for providing access to the various internal components. The housing 14 may also be configured to form a water-resistant or water-proof device. For example, the housing 14 may be formed from a single body and the openings in the body may be configured to cooperate with other components to form a water-resistant or water-proof barrier.

In some embodiments, one of the components included in the consumer product 10 may be one or more I/O systems. For example, the consumer product 10 may include a display 20 configured to output various information about the consumer product 10. The display 20 may also output data from applications and other programs that are being executed by the consumer product 10. For example, the consumer product 10 may provide information regarding the current time, health of a user, status notifications, notifications or messages received from externally connected devices or communicating devices and/or software executing on such devices. The consumer product 10 may also provide information about applications or otherwise display messages, video, operating commands, and so forth that are executing on the consumer product 10.

The display 20 of the consumer product 10 may also be configured to receive input. For example, the display 20 may be a touch screen display that incorporates capacitive touch electrodes. In embodiments where the display 20 is configured to receive input, the display 20 may have an input area. The input area may cover the entire display 20 or substantially all of the display 20. In another embodiment, the input area may cover only a portion of the display 20. Further, the display 20 may be a multi-touch display that is configured to receive and process various contact points received on the display.

The display 20 may include image pixels formed from light-emitting diodes (LEDs), organic LEDs (OLEDs), plasma cells, electronic ink elements, liquid crystal display (LCD) components, or other suitable image pixel structures. The shape, size and dimensions of the display 20 may also vary. For example, the display 20 may be planar or substantially planar. In other embodiments, the display 20 may be concave or convex. The display 20 may be shaped to cover or substantially cover a top portion of the housing 14. As such, the display 20 may have a shape that is similar to the shape of the housing 14. In other embodiments, the shape of the display 20 may differ from the shape and/or size of the housing 14.

The consumer product 10 may also have other input and output mechanisms. For example, the consumer product 10 may include or interface with one or more buttons 22, a crown 24, keys, dials, trackpads, microphones and the like. Each of these input mechanisms may be disposed on a top surface of the housing 14, a bottom surface of the housing 14 and/or on one or more sidewalls of the housing 14. The consumer product 10 may also include one or more speakers, headphone jacks and the like.

The consumer product 10 may also be configured to provide haptic output, audio output, visual output or combinations thereof. With respect to the haptic output, the consumer product 10 may have one or more haptic actuators that are configured to provide the haptic output. The haptic output, and other forms of output provided above, may vary based on a variety of factors. Some of these include, but are not limited to, how the consumer product 10 is being used, which applications are being executed, the information that is output on the display 20 and the like. For example, if the consumer product 10 is monitoring the health of the user, a first type of haptic output may be provided. Alternatively or additionally, if the consumer product 10 is being used as a time keeping device, a second type of haptic output may be provided. In yet another example, if a warning or message is output on the display 20, the warning or message may include a haptic output, visual output and an auditory output.

The type, feel and duration of the haptic output, the audio output and/or the visual output may also vary. For example, the type, feel and duration of the haptic output of the consumer product 10 based on an orientation of the consumer product 10 and/or a location or position of the consumer product 10 (e.g., with respect to a user, environmental conditions, whether the consumer product 10 is outside or inside and the like).

In addition to the above, the attachment unit 12 itself, or portions of the attachment unit 12, may be configured to provide and/or enhance haptic feedback. For example, the attachment unit 12 may have a haptic actuator disposed in an inner portion. In another embodiment, the accessory 18 that is coupled to the attachment unit 12 may be used to enhance and/or provide haptic output. In yet another embodiment, a haptic actuator disposed in the consumer product 10 may cause the attachment unit 12, or a portion of the attachment unit 12, to resonate or amplify the haptic output that is provided by the haptic actuator.

The consumer product 10 may include a connection system, either wired or wireless, that enables the consumer product to interface with other devices. These other devices may include laptop computers, mobile phones, tablet computers, exercise equipment, electronic glasses and the like.

The consumer product 10 may also include various other operating components (potentially housed with the housing 14). These components may include a processor, a memory, a communication system, an antenna and the like. For example, the consumer product 10 may include a processor coupled with or in communication with a memory. The consumer product 10 may also include one or more communication interfaces, The communication interface(s) can provide electronic communications between the communications device and any external communication network, device or platform, such as but not limited to wireless interfaces, Bluetooth interfaces, Near Field Communication interfaces, infrared interfaces, USB interfaces, Wi-Fi interfaces, TCP/IP interfaces, network communications interfaces, or any conventional communication interfaces.

The consumer product 10 may also include various sensors. These sensors may include and are not limited to, biometric sensors, gyroscopes, accelerometers, light sensors, optical sensors, global positioning sensors, and so on. These sensors may assist with or otherwise provide functionality to the consumer product 10. In addition, readings from these sensors may be analyzed by the consumer product 10 and/or may be transmitted to a companion device or other product.

The consumer product 10 may be a wrist worn device that utilizes bands or straps for attaching the consumer product 10 to a wrist. In such embodiments, the consumer product 10 may have a band that is coupled to each side of the consumer product 10. Further, each band may engage with or disengage with the attachment unit 12 located on respective sides of the consumer product 10.

For example, as shown in FIG. 1B, the band (or accessory 18) may include a first band strap 26 attached to a first attachment unit 12 of the consumer product 10 and a second band strap 28 attached to a second attachment unit 12 of the consumer product 10. In some embodiments, free ends of the first band strap 26 and the second band strap 28 may be configured to be releasably attached or secured to one another using a clasp 30 or other attachment mechanism to form a loop. This loop may then be used to attach the consumer product 10 to a user's wrist.

The first band strap 26 and the second band strap 28 may be formed from various materials that are suited for various applications. For example, the first band strap 26 and the second band strap 28 may be formed from leather, woven textiles, or metallic mesh materials. The materials and construction of the first band strap 26 and the second band strap 28 may depend on the application.

For example, the first band strap 26 and the second band strap 28 may be formed from a woven textile material configured for exposure to impact and moisture typically associated with outdoor activities. In another example, the first band strap 26 and the second band strap 28 may be formed from a metallic mesh material that may be configured to have a fine finish and construction that may be more appropriate for professional or social activities.

The clasp 30 may also be configured for a particular application and/or selected based on a particular style of band. For example, if the first band strap 26 and the second band strap 28 are formed from a metallic mesh material, the clasp 30 may include a magnetic clasp mechanism.

In other embodiments, the accessory 18 may be a unitary accessory. In such embodiments, a distal end of the accessory 18 may be configured to be coupled to a first attachment unit 12 and a proximal end of the accessory 18 may be configured to be coupled to a second attachment unit 12. In yet another example the accessory 18 may be coupled directly to, or may be manufactured to contain, a removable module. That is, the accessory 18 may designed to include a feature that is configured to slide within the housing 14 of the consumer product 10.

For example, the proximal end and/or the distal end of the accessory 18 may have a locking assembly that acts to secure the ends of the accessory 18 within the channel 16 of the housing 14. In addition, the ends of the accessory 18 may include one or more protrusions or friction pads such as described above. Further, the proximal end and/or the distal end of the accessory may be made from various materials including silicon, metal, and so on.

Figure 1D:
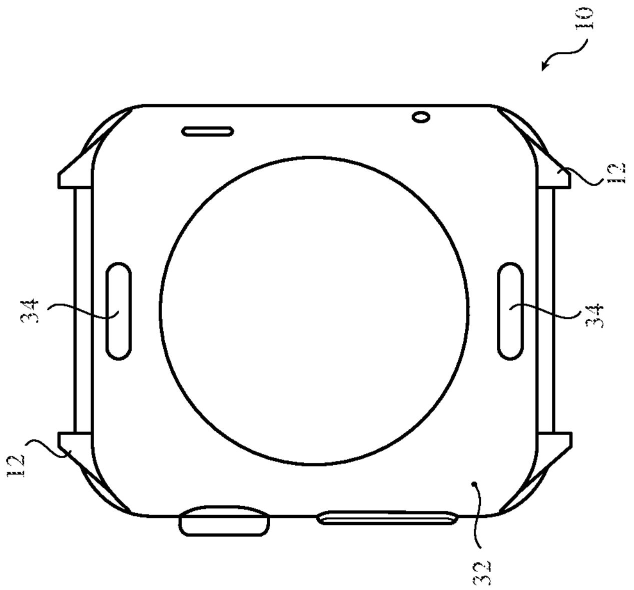
FIG. 1D illustrates a bottom view of the consumer product of FIG. 1A according to one or more embodiments of the present disclosure.
Figure 1C:
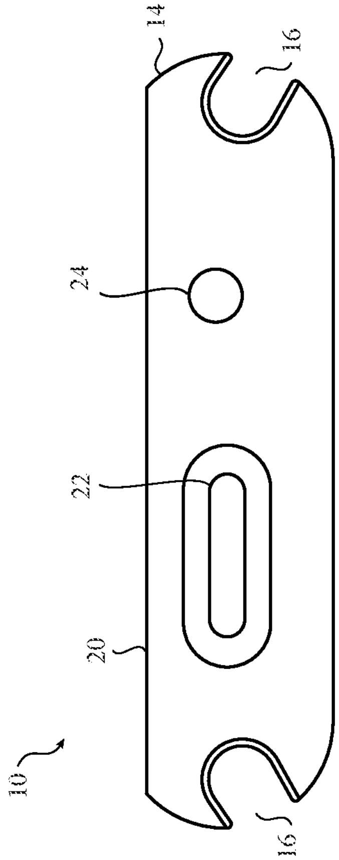
FIG. 1C illustrates a side view of the consumer product of FIG. 1A according to one or more embodiments of the present disclosure.

FIG. 1C illustrates a side view of the consumer product 10 of FIG. 1A according to one or more embodiments of the present disclosure. The housing 14 may have a three dimensional shape that is generally rectilinear. Although a rectilinear shape is shown and described, the housing 14 may be rounded, square, oval, arced, triangular, and have other such shapes.

In example depicted in FIG. 1A, the housing 14 can be described as having two ends (a first end and a second end opposite the first end), and a first side and a second side opposite the first side, the sides being continuous with the ends. In this example, the first end and the second end and the first side and the second side have an outwardly curved three-dimensional shape.

In some embodiments, a top side and a bottom side of the housing 14 may be substantially planar or flat. A display 20 may be positioned on the top side of the housing 14. When the display 20 ends, the housing 14 may transition from a flat or planar surface into one or more rounded edges. The rounded edges provide a smooth transition from the top side of the housing 14 to a sidewall of the housing 14 and from a sidewall of the housing 14 to a bottom side of the housing 14. The rounded edges of the housing 14 may cause a side profile of the housing to have a general lozenge shape although other shapes are contemplated.

In the example shown in FIG. 1C, the channel 16 is formed in the first end. Similarly, a second channel 16 is formed in the second end. In the present example the channels 16 have openings at the interface of the first and second sides and first and second ends. As also shown in FIG. 1C, the channel 16 of the housing 14 may be disposed on one or more sidewalls of the housing 14. Thus, as the rounded edges transition from the top surface to the bottom surface of the housing 14, the rounded edges may transition into the channel 16 itself. That is, the channel 16 may be carved directly into a solid portion of the housing 14. As such, the channel 16 may be positioned below the display 20 of the consumer product 10.

In some embodiments, the channel 16 may also have an inwardly curved three-dimensional shape with an undercut. For example, the channel 16 may have a width that is greater than the openings on a proximal end and/or a distal end of the channel 16. In some embodiments, the upper portion of the housing 14 overhangs the lower portion of the housing 14 at the channel 16 opening. In the example depicted in FIG. 1C, the channel 16 is cut into a solid portion of the housing 14 such that the channel 16 forms a continuous interior shape. As discussed above, the attachment unit 12 may have a shape and other dimensions that mirror those of the channel 16 and/or the housing 14.

In some embodiments, the channel 16 is formed at an angle relative to the centerline of the housing 14. In some embodiments, the channel 16 is located underneath a centerline of the housing 14. In some embodiments, the channel 16 is angled upward and inward within the profile of the housing 14, such that the channel 16 crosses a vertical centerline of the housing 14. In some embodiments, the channel 16 may be angled with respect to a centerline of the housing 14 at approximately five degrees or greater.

The channel 16 may be configured in a variety of shapes. For example, the channel 16 may be rounded such as shown in FIG. 1C. In other embodiments, the channel 16 may be rectilinear or have other shapes.

The channel 16 may also have an opening at a proximal end and another opening at a distal end. As discussed above, the channel 16 may extend along a side of the housing 14 such that the openings at each end are connected. In addition, the channel 16 may be shaped such that a lateral opening of the channel 16, as well as the proximal end and the distal end of the channel 16 follow the contour of the housing. As such, the openings may be slanted or otherwise curved based on the shape and dimensions of the housing 14. The openings may be on a curved surface and/or located inward of an outer dimension of the consumer product 10.

In some embodiments, the channel 16 may be shaped such that the openings at the proximal end and the distal end are slightly tapered. As the channel 16 progresses toward the center of the channel 16, the depth of the channel increases. Put another way, near the open ends of the channel 16, the channel 16 may have a shallow depth and as the channel 16 progresses within the housing 14, the depth of the channel increases. As each opening may be configured to receive an accessory (e.g., accessory 18) and/or an attachment unit 12 such as described above, the configuration of the channel 16 in this manner may assist in enabling the attachment unit 12 or accessory 18 to enter the channel 16.

In addition to the openings at the proximal ends and the distal end of the channel 16, a lateral slot may extend between the proximal end and the distal end of the channel 16. The lateral slot may provide space for an object to pass through the housing which enables the object to be attached to an attachment unit 12 contained within the channel 16 or otherwise be secured to the housing 14.

In some embodiments, the lateral slot may also be tapered or have a dimension that is narrower than the dimensions of the openings at each of the ends. That is, the proximal end and the distal end of the channel 16 may have a first dimension while the lateral slot of the channel 16 has a second dimension. In some embodiments, the second dimension is smaller than the first dimension. This configuration may help prevent forward insertion and/or removal of an accessory 18 and/or attachment unit 12 that are contained within the channel 16. For example, due to the narrower dimension of the lateral slot, an accessory 18 or attachment unit 12 may be prohibited from being pulled out of the front of the slot due to an applied "pulling" force on the attachment unit 12 or accessory 18. The lateral slot of the housing 14 may also be comprised of a rigid material which prevents or helps prevent the housing 14 from bending, expanding and so on.

FIG. 1D illustrates a bottom view of the consumer product 10 of FIG. 1A according to one or more embodiments of the present disclosure. In some embodiments, the bottom side 32 of the housing 14 may be flat or substantially flat such as described above. In addition, the bottom side 32 of the housing 14 may include a button assembly 34. In certain embodiments, the button assembly 34 is aligned with a recess in the channel 16. As discussed above, the button assembly 34 may be used to release a locking assembly of the attachment unit 12 from the channel 16.

Although FIG. 1D shows the button assembly 34 centrally positioned near the sides of the housing 14, the button assembly 34 may be positioned anywhere on the bottom side 32 of the housing 14. In addition, each side of the housing 14 may include a single button assembly 34 or multiple button assemblies 34. Further, although the button assembly 34 is shown on the bottom side 32 of the consumer product 10, the button assembly 34 may be positioned on a sidewall of the housing 14, a top side of the consumer product 10 and/or on the attachment unit 12.

As also shown in FIG. 1D, when the attachment unit 12 is inserted into the channel 16, the attachment unit 12 is contained within the channel 16. Thus, when the attachment unit 12 is contained within the channel 16, the attachment unit 12 may complete or otherwise fill the groove in the periphery of the housing 14 caused by the channel 16. As shown in FIG. 1D, one or more arms of the attachment unit 12 may extend from the channel 16. The arms may be used to secure an accessory 18 to the housing 14 such as described above.

The following description and their associated figures are directed to various attachment systems, attachment units, channels and/or housings that may be used by or otherwise integrated with a consumer product. In some cases, the attachment system includes a receiving mechanism on the consumer product and a lug or other such attachment unit that is configured to be removably received by the receiving mechanism. As such, the various attachment units described below may be similar to the attachment unit 12 described above. In addition, the housings, channels and consumer products described below may be similar to the housing 14, the channel 16 and the consumer product 10 described above. Further, each attachment unit 12 may be configured to be coupled to a band, a strap or other accessory such as described above. It is also contemplated that the various embodiments describe below may be combined in a variety of ways and are not limited to the illustrated embodiments.

Figure 2:
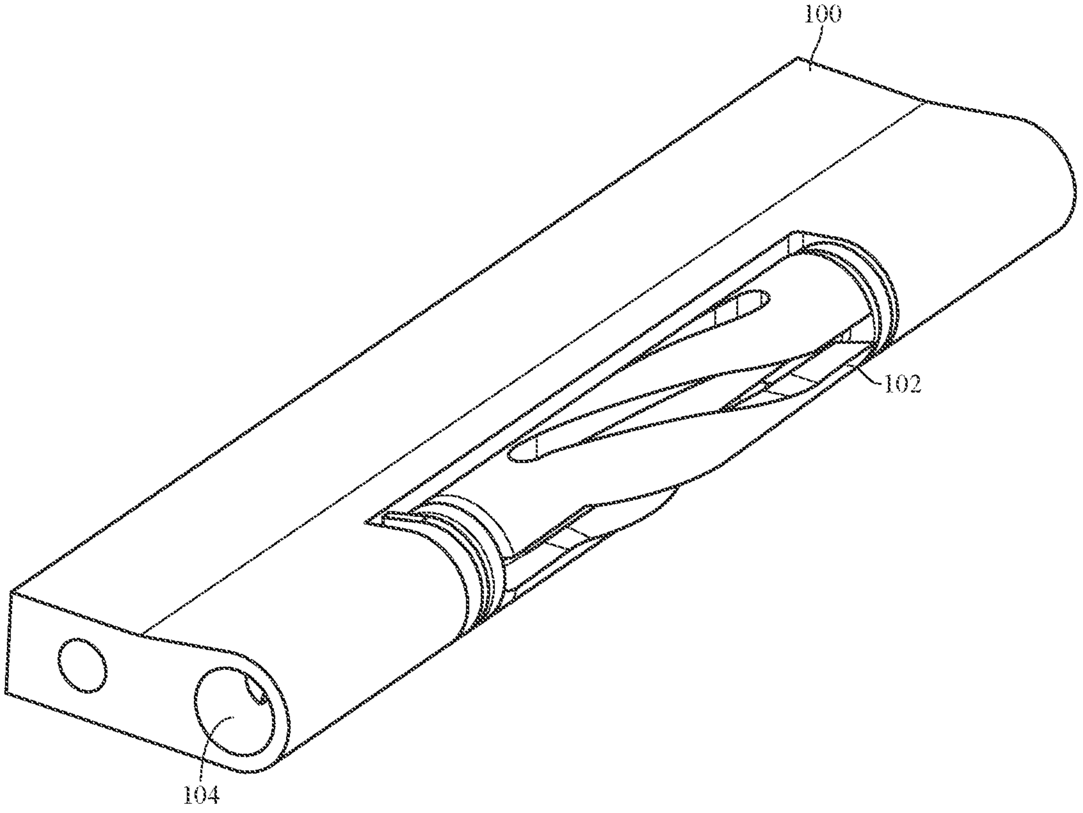
FIG. 2 illustrates an attachment unit having an expansion component as a locking mechanism according to embodiments of the present disclosure.

FIG. 2 illustrates an attachment unit 100 having an expansion component 102 according to embodiments of the present disclosure. More specifically, FIG. 2 illustrates an attachment unit 100 that incorporates an expansion component 102 as a locking mechanism. For example, when the attachment unit 100 has been inserted into a channel of a housing such as described above, the expansion component 102 may be used to secure the attachment unit 100 within the channel.

For example, the attachment unit 100 may include an opening 104 on a proximal end and/or a distal end such as shown in FIG. 2. The opening 104 may be configured to receive a tool or other actuation mechanism. When the actuation mechanism is actuated (e.g., turned, pushed, twisted etc.), a screw or other such mechanism that is coupled to or part of the expansion component 102 causes the diameter of the expansion component 102 to change from a first diameter to a second, greater diameter. As the expansion component 102 increases in diameter, the attachment unit 100 may be locked in place within the channel of the housing. In some embodiments, actuation of the actuation mechanism in an opposite direction (or further actuation in the same direction) causes the expansion component 102 to change its diameter from the second diameter back to the first diameter so the attachment unit 100 can be removed from the housing.

In some embodiments, the expansion component 102 may be made of plastic, rubber, metal or other such material that enables expansion and contraction of the expansion component 102 while still maintaining the integrity of the component.

Figure 3A:
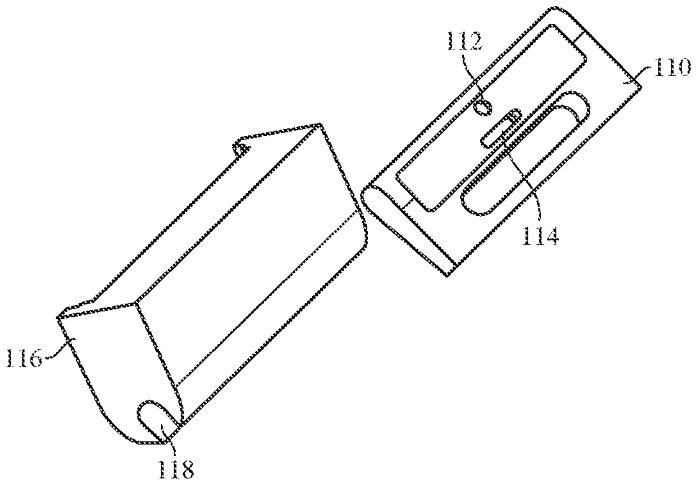
FIG. 3A-FIG. 3B illustrate an attachment unit having a ball detent and locking feature according to embodiments of the present disclosure.
Figure 3B:
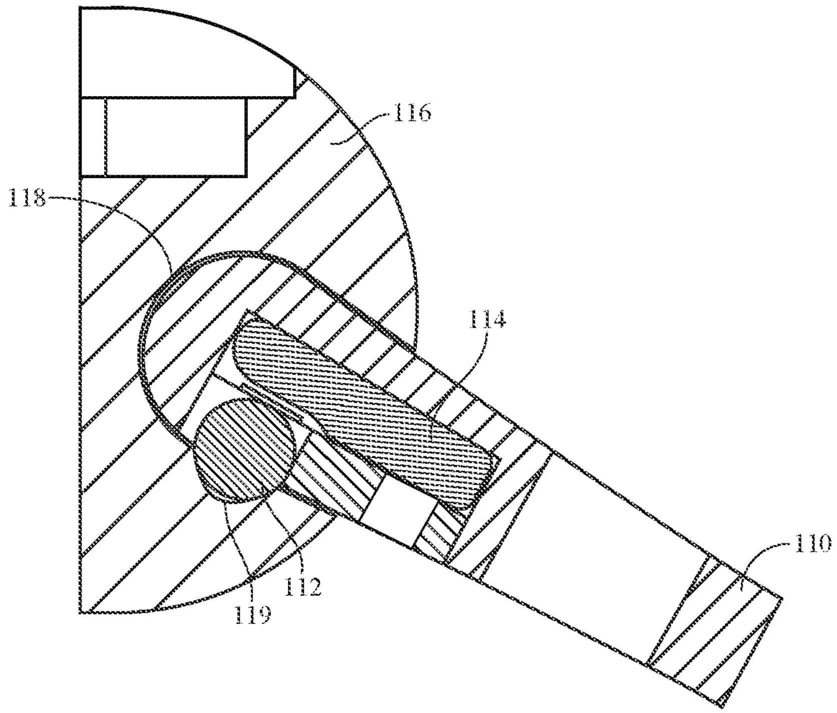

FIG. 3A-FIG. 3B illustrate an attachment unit 110 having a ball detent 112 and locking feature 114 according to embodiments of the present disclosure. As with the other attachment units described herein, the attachment unit 110 of this particular embodiments is configured to be received into a channel 118 of a housing 116. As will be described in detail below, the ball detent 112 and locking feature 114 are configured to secure the attachment unit 110 in place within the housing 116.

More specifically and as shown in FIG. 3B, the channel 118 may include one or more receiving recesses 119 that are configured to mate with the ball detent 112 of the attachment unit 110. That is, as the attachment unit 110 is inserted into the channel 118 of the housing 116, the ball detent 112 may contract which enables the attachment unit 110 to slide within the channel 118. When the ball detent 112 is in proximity to the receiving recess 119, the ball detent 112 expands into the receiving recess 119.

Once the ball detent 112 has been received into the receiving recess 119, the locking feature 114 may be used to lock and unlock movement (e.g., contraction and expansion) of the ball detent 112. For example, moving the locking feature 114 in a first direction may lock the movement or compression of the ball detent 112 which assists in securing the attachment unit 110 in place within the housing 116. Further, moving the locking feature 114 in the opposite direction may unlock movement of the ball detent 112. In some embodiments, the locking feature 114 may be a slideable mechanism although other locking features are contemplated. When the ball detent 112 has been unlocked, the attachment unit may be removed from the channel 118 of the housing 116.

In some embodiments and as shown in FIB. 3A and FIG. 3B, the ball detent 112 of the attachment unit 110 may be present on one or more surfaces of the attachment unit 110. In some embodiments, the ball detent 112 may protrude from both sides of the attachment unit 110 or a ball detent 112 may be present on both sides of the attachment unit 110. When two or more ball detents 112 are present, the same locking feature 114 (or sliding mechanism) or different locking features 114 (or sliding mechanisms), may be used to restrict the movement of the ball detents 112. In some embodiments, the ball detents 112 may be offset from one another or positioned perpendicular or parallel to each other.

Figure 4A:
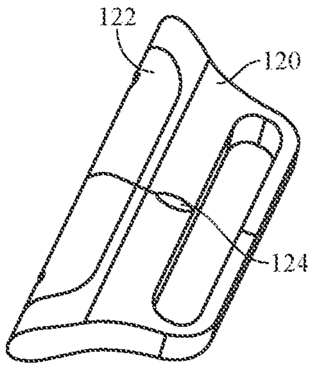
FIG. 4A-FIG. 4C illustrate an attachment unit having an expansion mechanism according to another embodiment of the present disclosure.
Figure 4B:
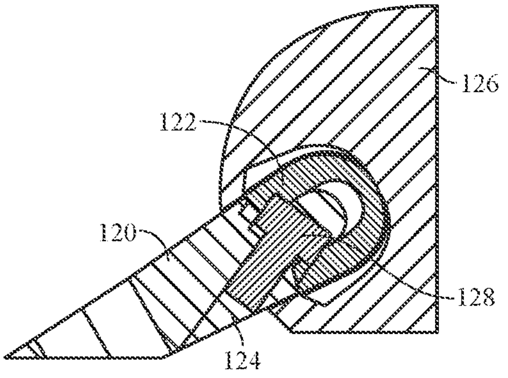
Figure 4C:
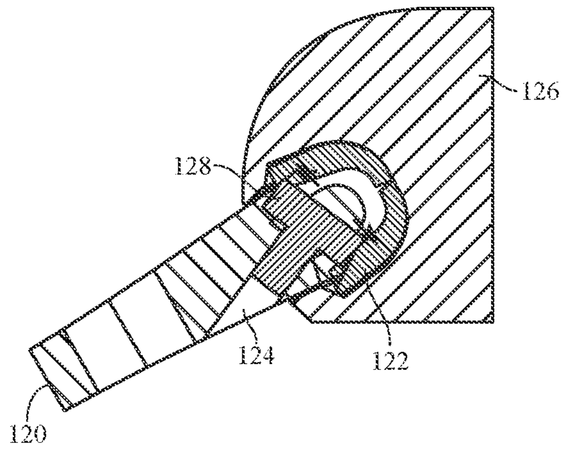

FIG. 4A-FIG. 4C illustrate an attachment unit 120 having an expansion mechanism 122 according to another embodiment of the present disclosure. As shown in FIG. 4A, the expansion mechanism 122 may be disposed on a transition surface between the top surface and the bottom surface of the attachment unit 120. More specifically, the expansion mechanism 122 may be part of the top surface, the transition surface and the bottom such as shown in FIG. 4A. The attachment unit 120 may also include an actuation hole 124 that is configured to receive an actuation mechanism.

Once the actuation mechanism has been inserted into the actuation hole 124, the expansion mechanism 122 may expand and contract based on movement of the actuation member. For example and as shown in FIG. 4B and FIG. 4C, the expansion mechanism 122 may be configured to contract or expand based on an orientation of an expansion unit 128 disposed within the expansion mechanism 122. In some embodiments, the expansion unit 128 is configured in a "T" or a "plus" (+) configuration. In this configuration, the expansion unit 128 may have a first set of crossbars having a first dimension and a second set of crossbars having a second dimension. Thus, as the expansion unit 128 is rotated from a first position such as shown in FIG. 4B, to a second position such as shown in FIG. 4C, the differing dimensions of the expansion unit 128 cause the expansion mechanism 122 to expand and contract accordingly.

As also shown in the figures, when the attachment unit 120 is within a channel of a housing 126, the expansion mechanism 122 may be configured to be received into and removed from recesses in the channel that follow the shape of the expansion mechanism 122. More specifically, when in the expanded state, the expansion mechanism 122 is received into corresponding recesses within the channel of the housing 126 which locks the attachment unit 120 in place within the channel. When the expansion mechanism 122 is in the contracted state, the expansion mechanism 122 is not secured within the recess and the attachment unit 120 may be removed from the channel.

Figure 5B:
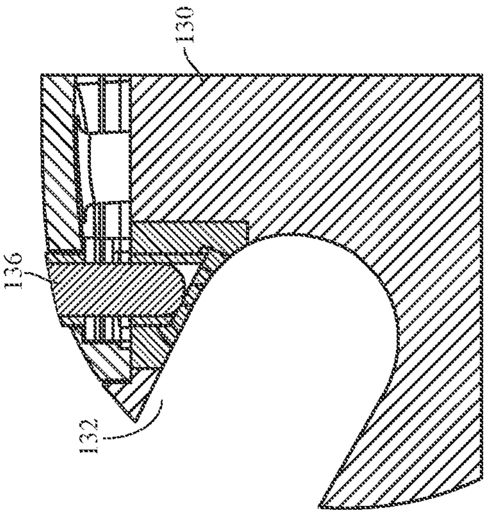
FIG. 5A and FIG. 5B illustrate a housing of a consumer product having a plunger button assembly according to one or more embodiments of the present disclosure.
Figure 5A:
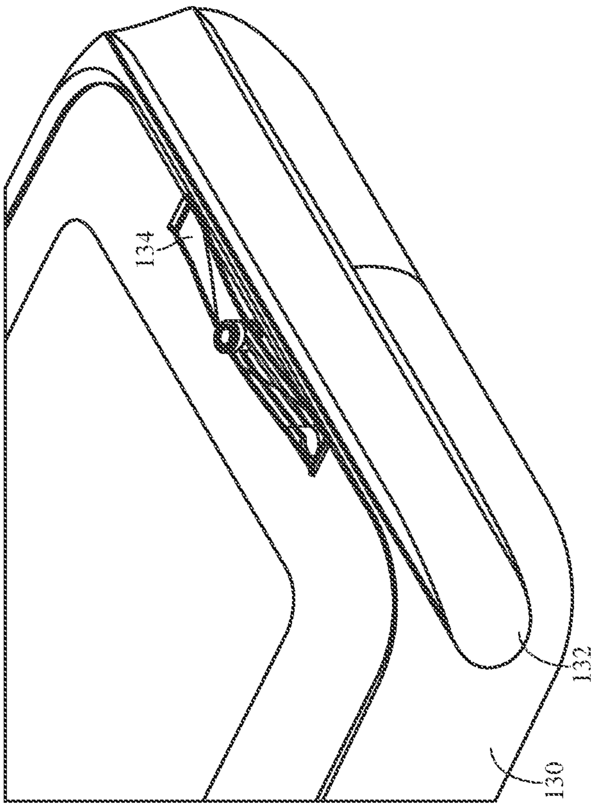

FIG. 5A and FIG. 5B illustrate a housing 130 of a consumer product having a plunger button assembly 134 according to one or more embodiments of the present disclosure. As with the various housings described above, the housing 130 includes a channel 132 that is configured to receive an attachment unit (not shown) such as the various attachment units described herein.

With respect to FIG. 5B, FIG. 5B illustrates a side cross-section view of the housing 130. As discussed, the housing 130 includes a plunger button assembly 136. The plunger button assembly 136 may be positioned above the channel 132 and more specifically, above a recess within the channel 132. Further, the plunger button assembly 136 may be spring-biased flush or substantially flush with respect to the housing 130. In other embodiments, the plunger button assembly 136 may protrude from a surface of the housing 130.

When an attachment unit has been received within the channel 132, and when a locking mechanism of the attachment unit has been received by the recess within the channel 132, actuation of the plunger button assembly 136 may cause the locking mechanism of the attachment unit to be expelled from the recess. Once the plunger button assembly 134 has been actuated, a spring mechanism that is part of the plunger button assembly 136 may be used to return the plunger to its nominal position. In some embodiments, the plunger button assembly 134 may be sized such that actuation of the plunger is made by a tool or other such actuation mechanism.

Figure 6A:
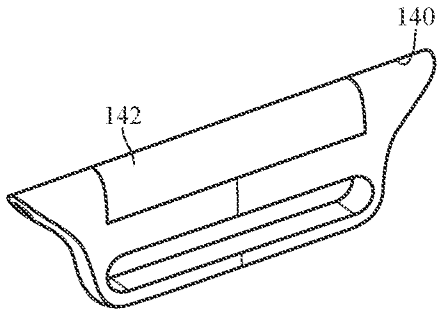
FIG. 6A-FIG. 6E illustrate an attachment unit having a compressible expansion component according to another embodiment of the present disclosure.
Figure 6B:
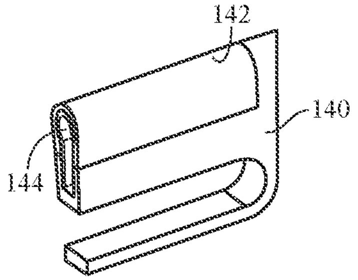
Figure 6C:
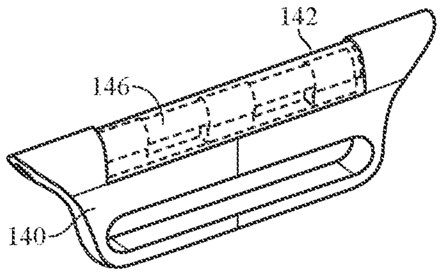

FIG. 6A-FIG. 6E illustrate an attachment unit 140 having a compressible expansion component 142 according to embodiments of the present disclosure. In this embodiment, the expansion component 142 may be positioned on a front end of the attachment unit 140 and may extend to one or more surfaces of the attachment unit 140. The expansion component 142 may be made of rubber or other malleable material. The expansion component 142 may also include a spring hole 144 that runs entirely (or partially) through the expansion component 142 such as shown in FIG. 6C. The spring hole 144 is configured to receive a pin 146 or other actuation mechanism that causes the expansion component 142 to move from a first state, in which the expansion component 142 is relatively smooth, to a second state in which the expansion component 142 has buckled.

Figure 6D:
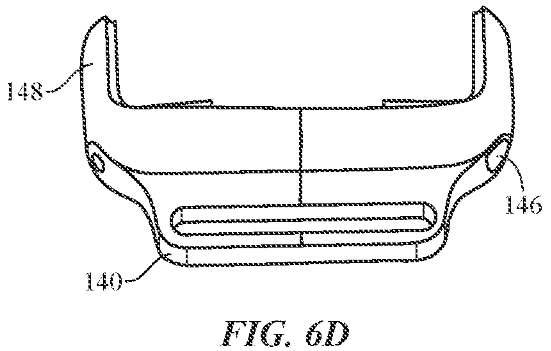
Figure 6E:
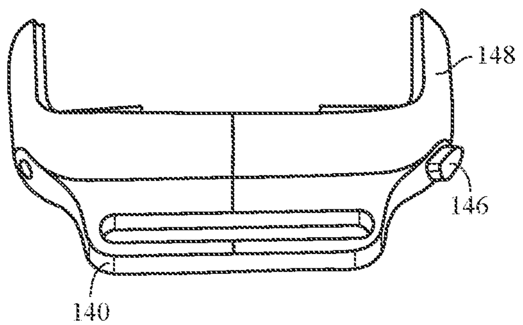

More specifically, the attachment unit 140 is configured to receive a pin 146 that has a dimension (e.g., a diameter) that is larger or greater than a dimension (e.g., a diameter) of the spring hole 144. As the pin 146 is inserted into the spring hole 144, the large diameter of the pin 146 causes the expansion component 142 to buckle and/or expand in an outward manner (e.g., out toward the channel of the housing 148). This expansion provides a force to fix the attachment unit 140 within the channel of a housing 148 such as shown in FIG. 6D (e.g., the pin 146 is flush or substantially flush with respect to one or more sidewalls of the attachment unit 140). The pin may be subsequently pushed out of the opening such as shown in FIG. 6E which causes the expansion component 142 to return to its nominal state.

Figure 7A:
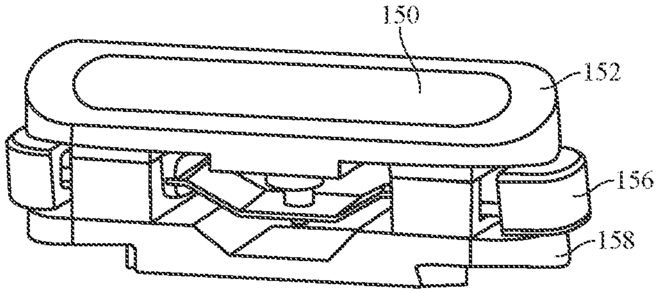
FIG. 7A-FIG. 7E illustrate various views of a button and locking assembly that may be used with one or more embodiments of the present disclosure.

FIG. 7A-FIG. 7E illustrate various views of a button and locking assembly that may be used with one or more embodiments of the present disclosure. More specifically, the button and locking assembly shown in these figures may be used in a housing of a consumer product. As shown in FIG. 7A, the button assembly includes spring biased flanges 156 that laterally extend from various sides of the button assembly. The spring biased flanges 156 may be used to secure the button assembly within the housing such that the button assembly is flush with respect to a surface of the housing and also locks an attachment unit in place within the housing.

Figure 7B:
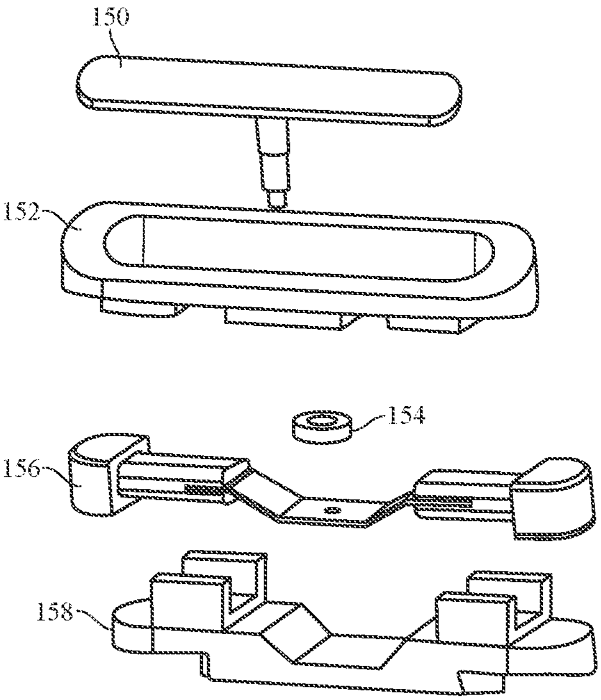

With respect to FIG. 7B, FIG. 7B illustrates an exploded view of the button assembly of FIG. 7A. As shown, the button assembly includes a button 150, a button top 152, a constrain ring 154, a spring sheet 162 having at least one flange 156 and a bottom portion 158.

Figure 7C:
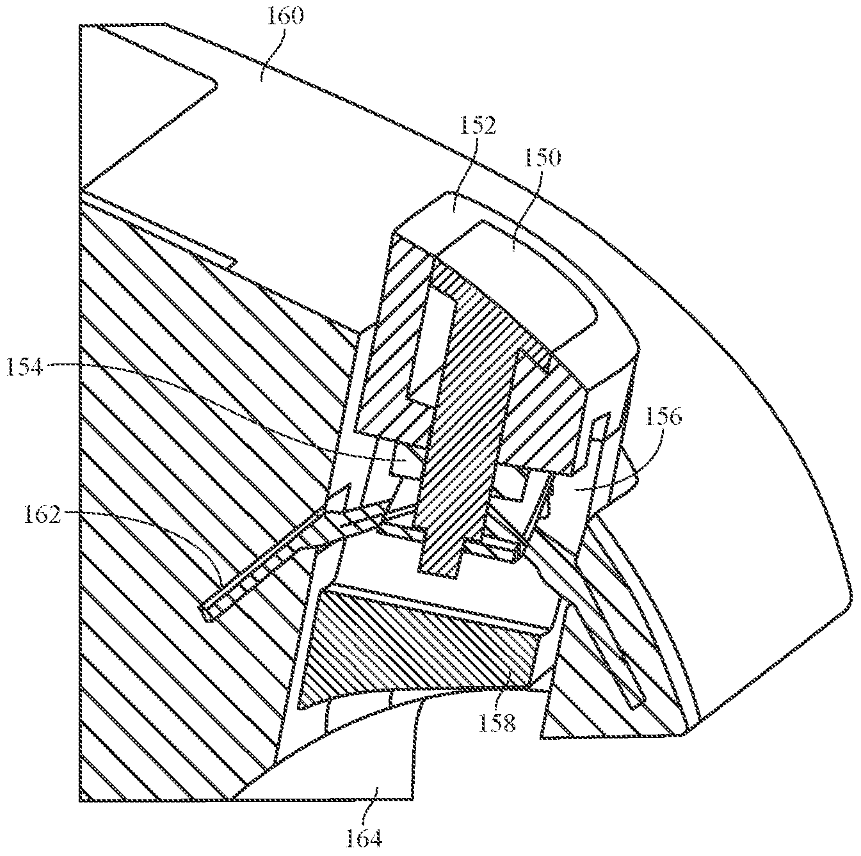
Figure 7D:
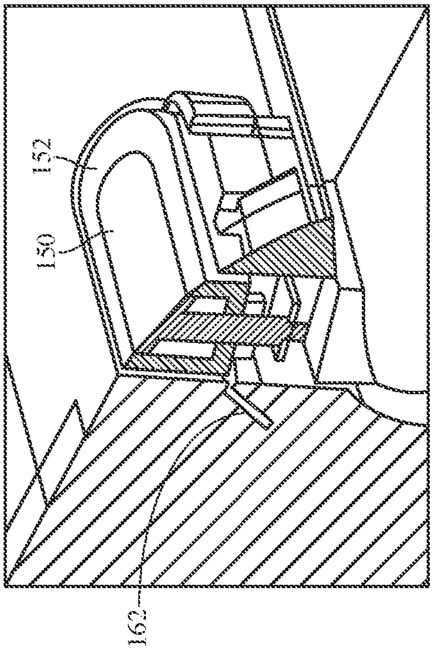

When the button assembly is first inserted into a housing 160 such as shown in FIG. 7C, the button 150 and button top 152 are actuated simultaneously or substantially simultaneously. In response to this actuation, both ends of the spring sheet 162 (and more specifically the flanges of the spring sheet 162) will extend to an undercut within the housing 160 which holds the button assembly in place within the housing 160. As shown in FIG. 7D, the button assembly may be held flush or substantially flush with respect to the housing 160.

Figure 7E:
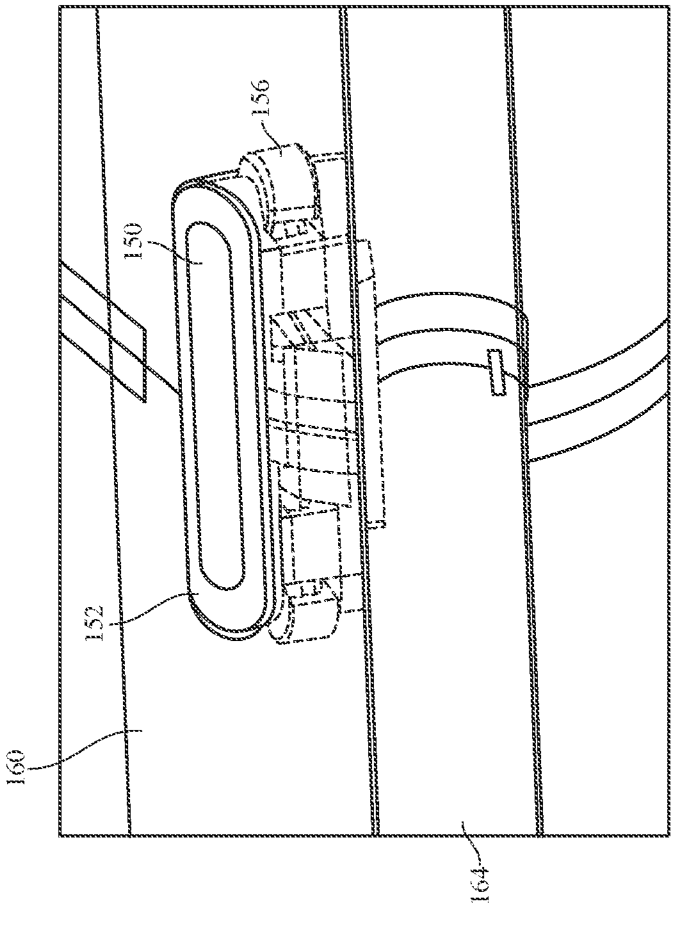

In addition, the bottom portion 158 of the button assembly, and more specifically a catch member of the bottom portion 158 may extend through the recess (e.g., the recess in which the button assembly is inserted) such as shown in FIG. 7E. The catch member may be received into a recess on an attachment unit (not shown).

To release the catch member from the attachment unit, the button 150 is actuated. In response to this actuation, pin portion on the underside of the button 150 (shown in FIG. 7B) will push the spring sheet 162 downward and the ends of the spring sheet 162 will retract inside the button assembly and release the button from the constrain of the undercut. In addition, the spring sheet 162 will cause the catch member to retract thereby permitting the attachment unit to be removed from the housing.

FIG. 8A-FIG. 8E illustrate various embodiments of a button assembly for use in a housing of a consumer product. In some embodiments, the button assembly 170 may be similar to the button assembly 34 described above with respect to FIG. 1D.

Figure 8A:
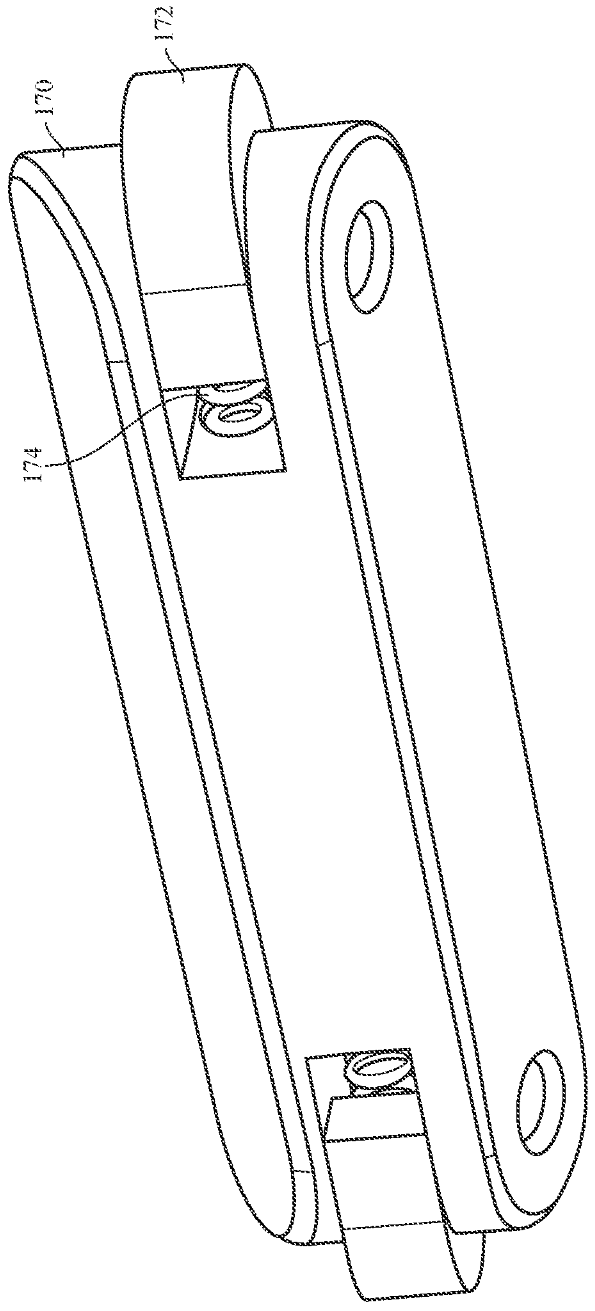
FIG. 8A-FIG. 8E illustrate various embodiments of a button assembly for use in a housing of a consumer product.

Turning to FIG. 8A, the button assembly 170 may include retainer blocks 172 that extend from the button assembly 170. The retainer blocks 172 may extend and/or retract using one or more spring mechanisms 174 disposed within the button assembly 170. In some embodiments the button assembly 170 may include one or more holes on the bottom button surface that may be used to receive pins that hold the retainer blocks 172 in a retracted state during assembly.

The button assembly 170 may be configured for insertion into a button recess within a housing. The button recess may be positioned above or below a locking assembly recess within a channel of the housing. When the button assembly 170 is inserted into the button recess, the pin or pins may be removed and the retainer blocks 172 are received into corresponding retainer block recesses in the housing. In some embodiments, the recesses are positioned such that the button assembly 170 is flush or substantially flush with respect to the housing.

When the button assembly 170 is actuated (e.g., to release a locking assembly from a recess within the channel of the housing), the spring mechanisms 174 cause the button assembly 170 to move within the button recess in the housing. As the button assembly 170 moves, it may expel a locking mechanism from the recess within a channel such as described above.

Figure 8B:
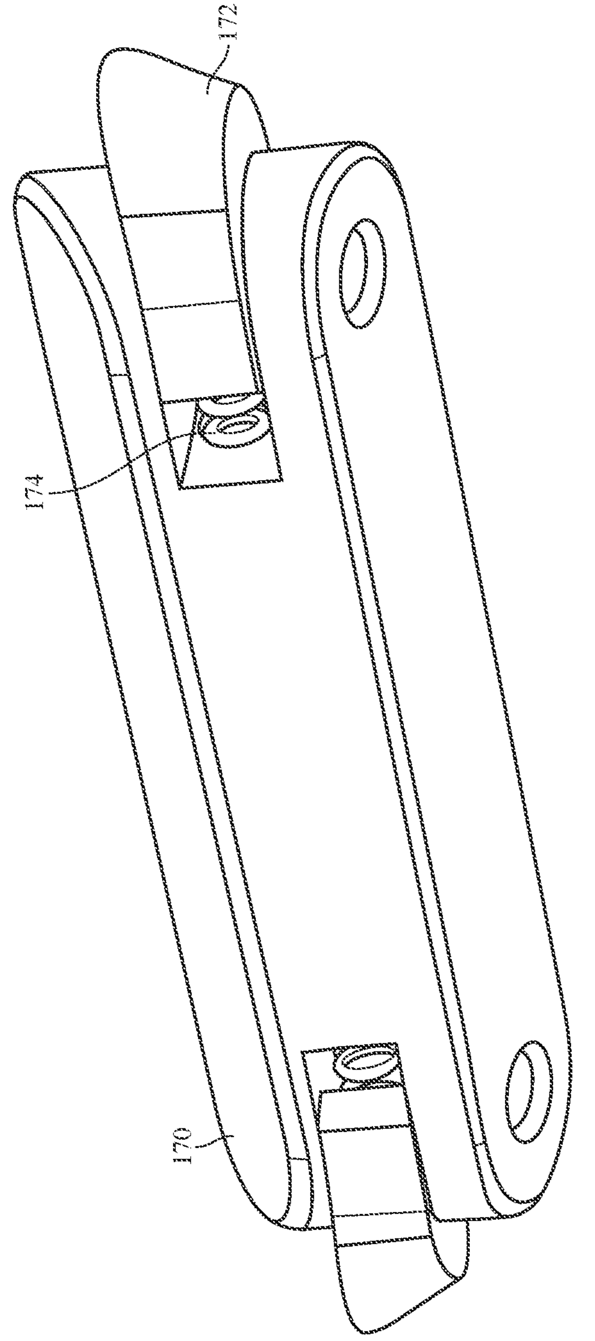
Figure 8C:
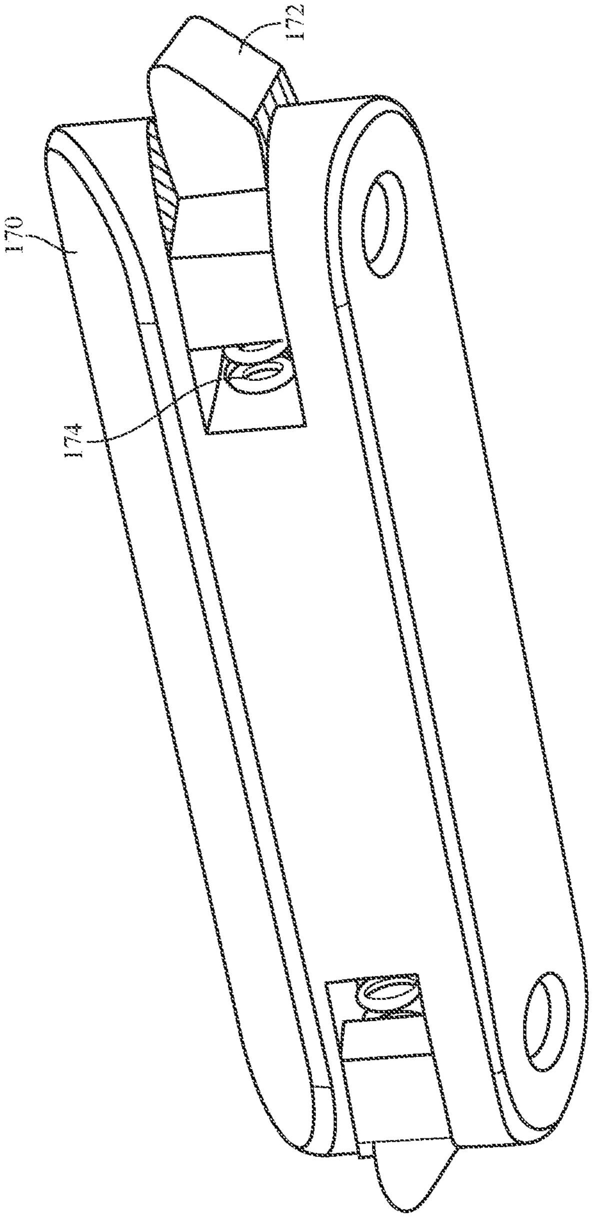
Figure 8D:
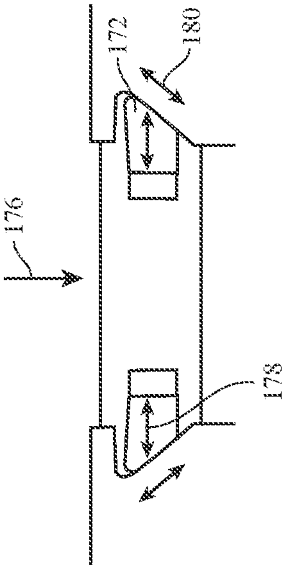
Figure 8E:
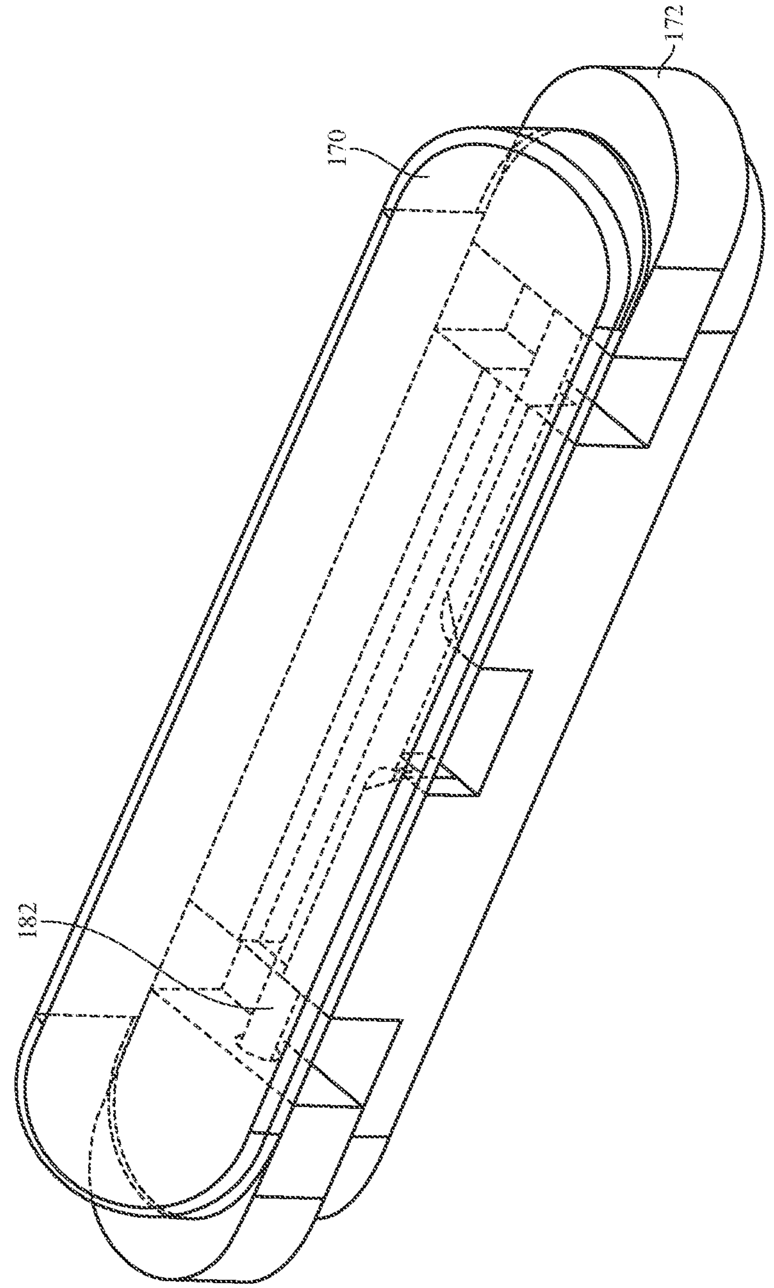

In some embodiments the retainer blocks 172 may include chamfers such as shown in FIG. 8B. In another embodiment shown in FIG. 8C, the retainer blocks 172 may be configured to expand and retract based on actuation of the button assembly. For example, as shown in FIG. 8D, actuation of the button assembly 170 in the direction of arrow 176 causes the retainer blocks 172 to move in the direction of arrow 178 which enables the button assembly 170 to slide along the path 180. In yet another embodiment shown in FIG. 8E, a shape memory allow wire 182 may be used to extend and retract the retainer blocks 172.

Figure 9A:
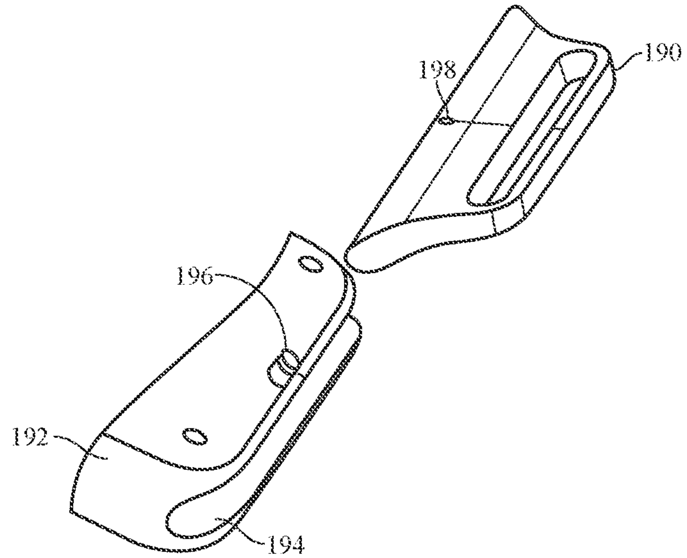
FIG. 9A and FIG. 9B illustrate an attachment system having a ball detent and locking assembly disposed within a housing of a consumer product according to another embodiment of the present disclosure.
Figure 9B:
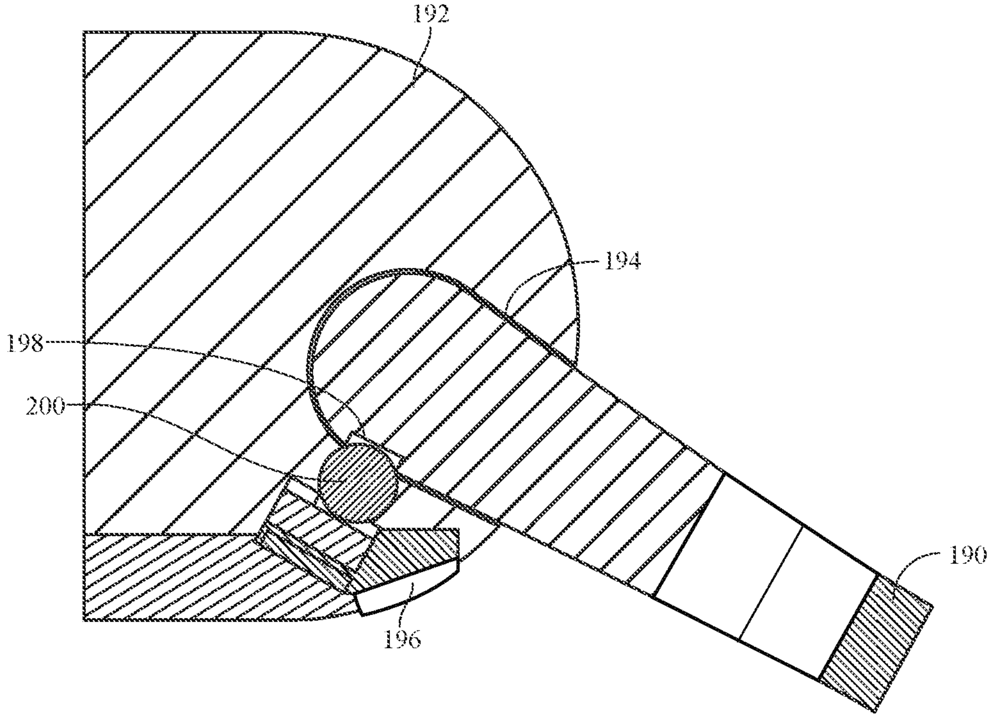

FIG. 9A and FIG. 9B illustrate an attachment system having a ball detent 200 and locking assembly 196 disposed within a housing 192 of a consumer product according to another embodiment of the present disclosure. In this embodiment, the attachment system includes an attachment unit 190 having a recess 198 disposed on at least one surface. As with other embodiments described herein, the attachment unit 190 is configured to be received into a channel 194 of the housing 192 of the consumer product.

As the attachment unit 190 enters the channel 194 and when the ball detent 200 is in proximity to the recess 198, the ball detent 200 may be received into the recess 198 of the attachment unit 190 such as shown in FIG. 9B. Once the ball detent 200 has been secured within the recess 198, the locking assembly 196 may be moved from a first position to a second position to which prevents or otherwise prohibits the ball detent from contracting.

Figure 10A:
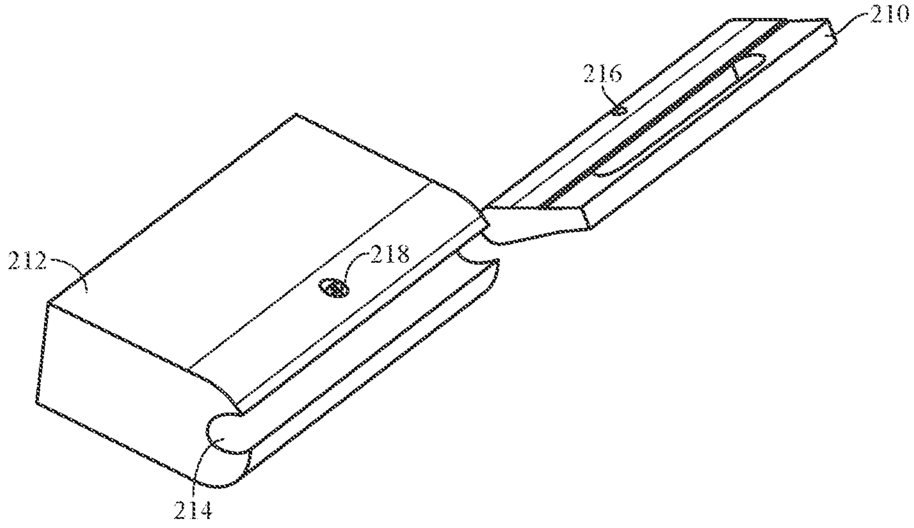
FIG. 10A-FIG. 10B illustrate an attachment system having a set screw that is configured to secure an attachment unit within a housing of a consumer product according embodiments of the present disclosure.
Figure 10B:
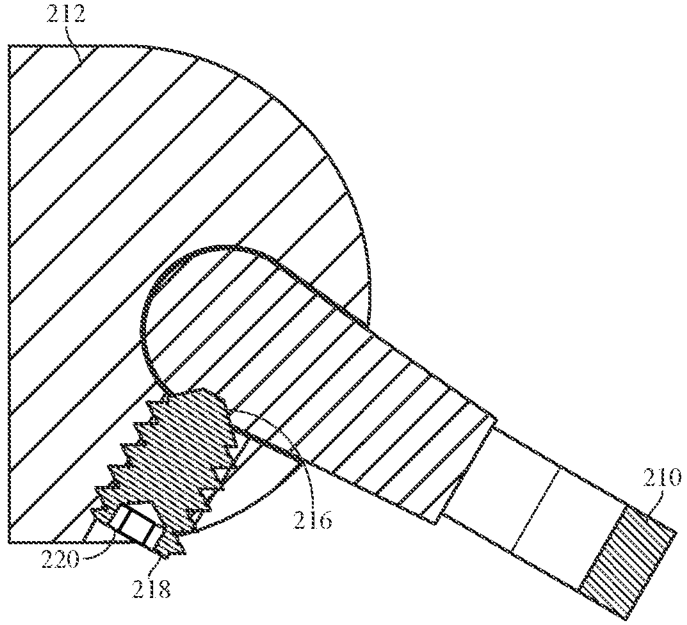

FIG. 10A-FIG. 10B illustrate an attachment system having a set screw 218 that is configured to secure an attachment unit 210 within a housing 212 of a consumer product according embodiments of the present disclosure. With respect to FIG. 10A, FIG. 10A illustrates an exemplary attachment unit 210 that is configured for insertion into a channel 214 of a housing 212. The attachment unit 210 may include a recess 216 that is shaped or otherwise configured to receive a set screw 218 disposed though a recess in the housing 212.

For example and as shown in the cross-sectional view of FIG. 10B, when the attachment unit 210 has been inserted into the channel 214 of the housing 212 and the recess 216 is in proximity to the set screw 218, a tool or other action mechanism may be inserted into a top portion 220 of the set screw 218. As the set screw 218 is rotated, the set screw 218 enters the recess 216 and secures the attachment unit 210 within the channel 214. Movement of the set screw 218 in the opposite direction causes the set screw 218 to be removed from the recess 216.

Figure 11A:
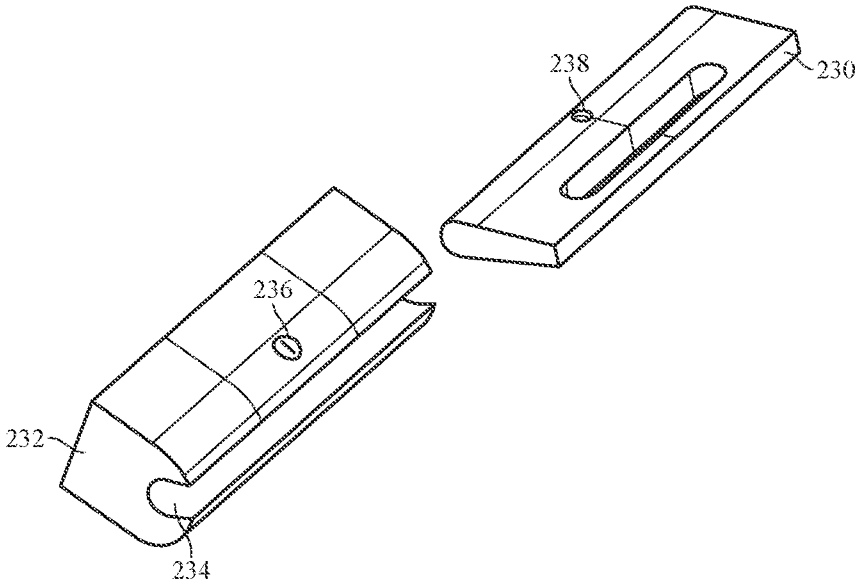
FIG. 11A-FIG. 11B illustrate an attachment system having a rotatable locking mechanism disposed within a housing of a consumer product according to embodiments of the present disclosure.
Figure 11B:
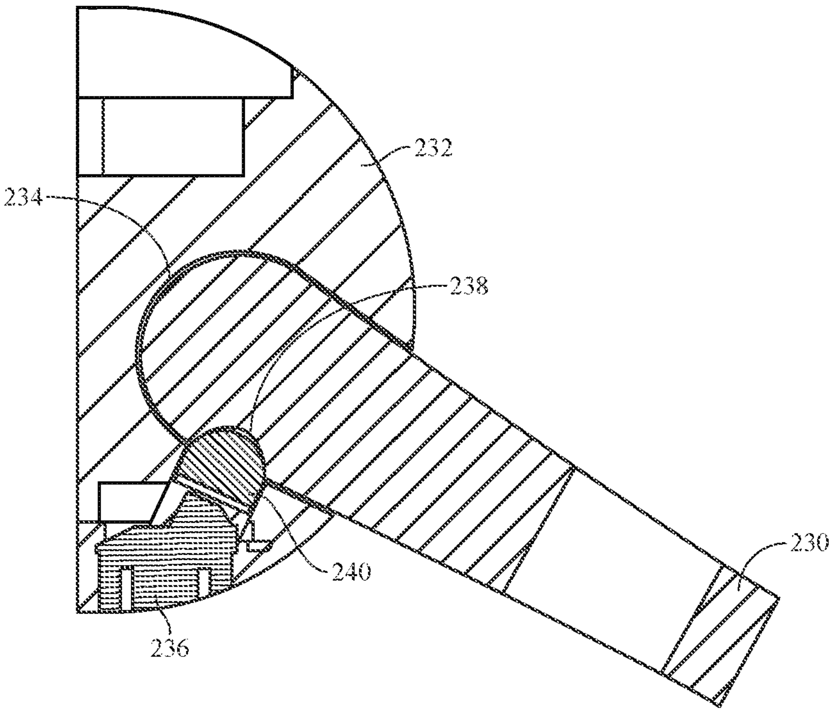

FIG. 11A-FIG. 11B illustrate an attachment system having an actuation mechanism 236 disposed within a housing 232 of a consumer product according to embodiments of the present disclosure. With respect to FIG. 11A, FIG. 11A illustrates an exemplary attachment unit 230 that is configured for insertion into a channel 234 of a housing 232. The attachment unit 230 may include a recess 238 that is shaped or otherwise configured to receive a locking mechanism 240.

For example and as shown in the cross-sectional view of FIG. 11B, when the attachment unit 230 has been inserted into the channel 234 of the housing 232 and the recess 238 is in proximity to the locking mechanism 240, an actuation mechanism 236 associated with the locking mechanism 240 is actuated (e.g., turned) which causes the locking mechanism 240 to be received within the recess 238. In some embodiments, the turn may be as little as half of a turn in order to move the locking mechanism 240 from a retracted position to an extended position such as shown in FIG. 11B.

Figure 12A:
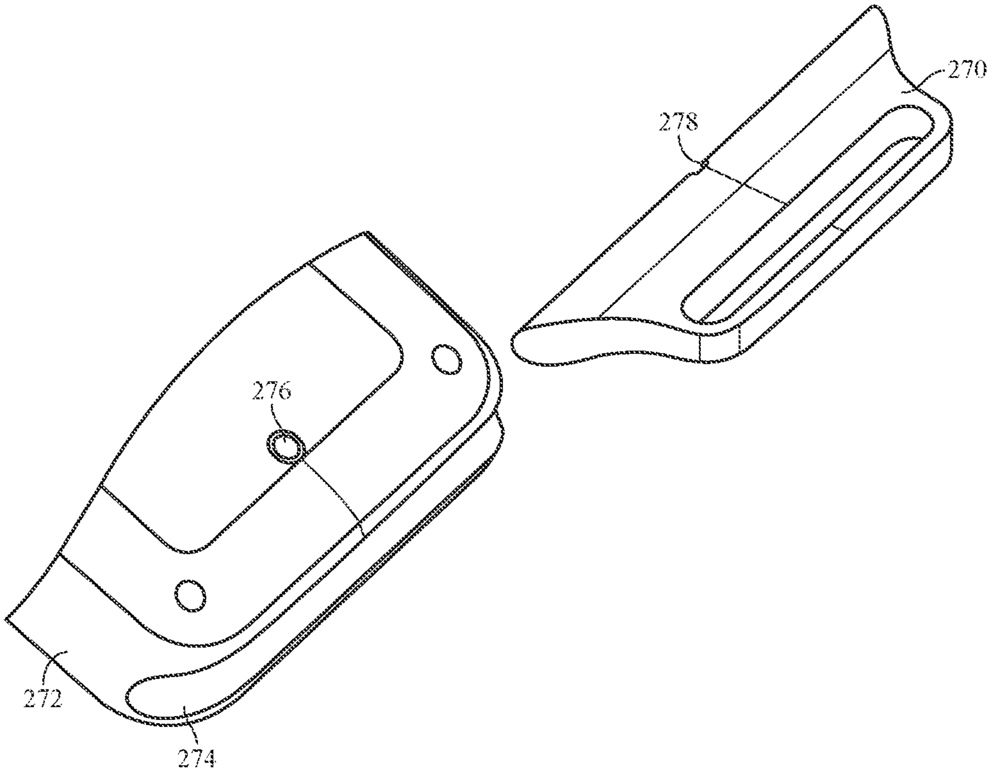
FIG. 12A-FIG. 12B illustrate a push-push locking assembly disposed within a housing of a consumer product according to one or more embodiments of the present disclosure.
Figure 12B:
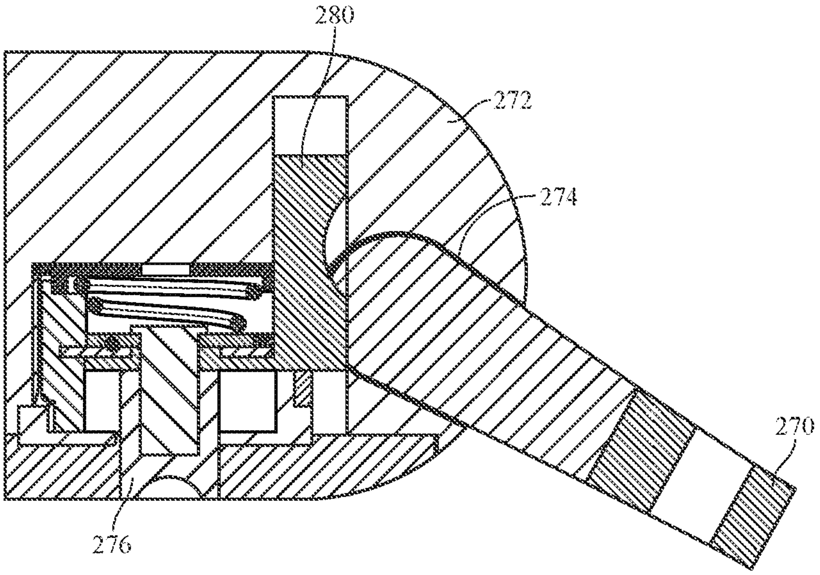

FIG. 12A-FIG. 12B illustrate an attachment system having a push-push locking assembly 276 according to embodiments of the present disclosure. The attachment system described in these figures includes an attachment unit 270 having a recess 278 disposed on one or more surfaces. The attachment unit 270 is configured for lateral insertion into a channel 274 of a housing 272 of a consumer product.

Once the attachment unit 270 has been inserted into the channel 274 and the recess is in proximity to the push-push locking assembly 276, the push-push locking assembly 276 may be actuated. In response to the actuation, an hourglass mechanism 280 may be moved from a first state (that enabled the attachment unit 270 to be inserted into the channel 274 of the housing 272) to a second state in which a portion of the hourglass mechanism 280 is received into the recess 278.

More specifically, when the attachment unit 270 is to be inserted into the channel 274, the push-push locking assembly 276 is actuated which causes the hourglass mechanism 280 to move from its nominal state to a second state that enables the attachment unit 270 to pass by the narrow portion of the hourglass mechanism 280. Once the attachment unit 270 has been inserted into the channel 274 of the housing 272, the push-push locking assembly 276 is actuated again which causes the hourglass mechanism 280 to return to its nominal position thereby locking the attachment unit 270 in place within the channel 274.

Figure 12C:
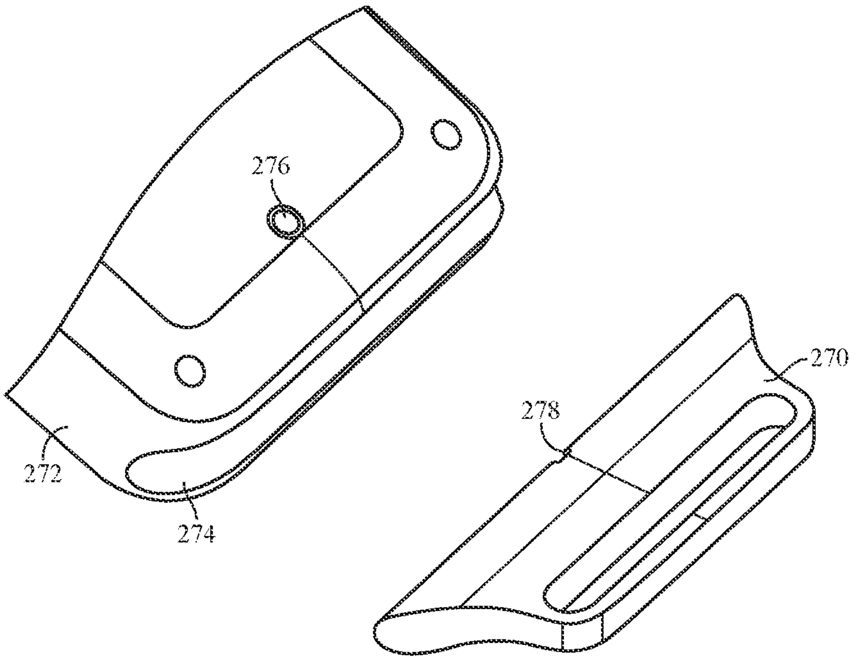
FIG. 12C illustrates a push-push locking assembly disposed within a housing of a consumer product according to one or more embodiments of the present disclosure.

In the embodiments described above, the attachment unit 270 is configured to be received into a channel of a housing of a consumer product. This may be done by sliding the attachment unit 270 into an open end of the channel and in some embodiments may be done by forward insertion (e.g., inserting the attachment unit 270 into the channel 274 through the perpendicular slot in the channel 274) (FIG. 12C). In some embodiments the channel 274 and the attachment unit 270 may take on a variety of shapes and sizes. Further the shape and/or curvature of the channel 274 may follow the shape and/or curvature of the housing 272.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

Further, regardless of whether the features shown and described herein are shown and described in combination or separately, the various features, including structural features and methodological features, are intended to be selectively included or omitted to produce an embodiment with a particular set of features. Further, the directions and orientations described above may be reversed. For example a top portion or surface in one embodiment may be a bottom portion or surface in another embodiment. Likewise, a bottom portion or surface in one embodiment may be a top surface or portion in another embodiment. Having been provided with the description and illustration of the present application, one skilled in the art may envision variations, modifications, and alternate embodiments falling within the spirit of the broader aspects of the embodiments described herein that do not depart from the broader scope of the claimed embodiments.

We claim:

1. A watch comprising:

a housing comprising:

a top surface;

a bottom surface;

a channel on a side of the housing that is between the top surface and the bottom surface;

a locking assembly including a locking element configured to be received into the channel, a first portion of the locking assembly being accessible at the bottom surface;

a first portion forming an entirety of the channel; and a second portion, wherein at least a second portion of the locking assembly is between the first portion and the second portion; and a band comprising:

an attachment unit configured to be inserted into the channel; and a recess disposed on a surface of the attachment unit, wherein the locking assembly is spring-biased toward the bottom surface of the housing and the locking element is spring-biased to engage the recess of the band.

2. The watch of claim 1, wherein the locking element comprises an hourglass mechanism.

3. The watch of claim 1, wherein the attachment unit is configured to be inserted laterally into the channel of the housing in a direction that is across the housing until the locking assembly engages the recess of the band.

4. The watch of claim 1, wherein the attachment unit is configured to be inserted forwardly into the channel of the housing in a direction that is toward the housing until the locking assembly engages the recess of the band.

5. The watch of claim 1, wherein:

the channel is a first channel;

the locking assembly is a first locking assembly;

the side is a first side; and the housing further comprises:

a second channel on a second side of the housing that is between the top surface and the bottom surface; and a second locking assembly, a portion of the second locking assembly being accessible at the bottom surface.

6. A watch comprising:

a housing comprising:

a top surface;

a bottom surface;

a channel on a side of the housing that is between the top surface and the bottom surface;

a locking assembly including a locking element configured to be received into the channel, a first portion of the locking assembly being accessible at the bottom surface;

a first portion forming an entirety of the channel; and a second portion, wherein at least a second portion of the locking assembly is between the first portion and the second portion; and a band comprising:

an attachment unit configured to be inserted into the channel; and a recess disposed on a surface of the attachment unit, wherein the attachment unit is configured to be inserted forwardly into the channel of the housing in a direction that is toward the housing until the locking assembly engages the recess of the band.

7. The watch of claim 6, wherein the locking element comprises an hourglass mechanism.

8. The watch of claim 6, wherein the housing further comprises a spring between the first portion and the at least second portion of the locking assembly.

9. The watch of claim 6, wherein:

the channel is a first channel;

the locking assembly is a first locking assembly;

the side is a first side; and the housing further comprises:

a second channel on a second side of the housing that is between the top surface and the bottom surface; and a second locking assembly, a portion of the second locking assembly being accessible at the bottom surface.

10. A watch comprising:

a housing comprising:

a first portion forming an entirety of a channel; and a second portion coupled to the first portion; and a locking assembly including a locking element configured to be received into the channel, a first portion of the locking assembly being accessible at the second portion, wherein at least a second portion of the locking assembly is between the first portion and the second portion; and a band comprising:

an attachment unit configured to be inserted into the channel; and a recess disposed on a surface of the attachment unit, wherein the locking assembly is spring-biased toward the second portion of the housing and the locking element is spring-biased to engage the recess of the band.

11. The watch of claim 10, wherein the locking element comprises an hourglass mechanism.

12. The watch of claim 10, wherein the attachment unit is configured to be inserted laterally into the channel of the housing in a direction that is across the housing until the locking assembly engages the recess of the band.

13. The watch of claim 10, wherein the attachment unit is configured to be inserted forwardly into the channel of the housing in a direction that is toward the housing until the locking assembly engages the recess of the band.

14. The watch of claim 10, wherein the housing further comprises a spring between the first portion and the at least second portion of the locking assembly.

15. The watch of claim 10, wherein:

the channel is a first channel;

the locking assembly is a first locking assembly;

the housing further comprises:

a second channel; and a second locking assembly, a portion of the second locking assembly being accessible at the second portion.

* * * * *